United States Patent
Kim et al.

(10) Patent No.: US 10,800,947 B2
(45) Date of Patent: Oct. 13, 2020

(54) RELEASE LAYER INCLUDING AT LEAST ONE FLUOROSILICON COMPOUND

(71) Applicant: Dow Silicones Corporation, Midland, MI (US)

(72) Inventors: Ginam Kim, Midland, MI (US); Junying Liu, Midland, MI (US)

(73) Assignee: Dow Silicones Corporation, Midland, MI (US)

( * ) Notice: Subject to any disclaimer, the term of this patent is extended or adjusted under 35 U.S.C. 154(b) by 119 days.

(21) Appl. No.: 16/091,232

(22) PCT Filed: May 10, 2017

(86) PCT No.: PCT/US2017/031860
§ 371 (c)(1),
(2) Date: Oct. 4, 2018

(87) PCT Pub. No.: WO2017/200809
PCT Pub. Date: Nov. 23, 2017

(65) Prior Publication Data
US 2019/0119531 A1 Apr. 25, 2019

Related U.S. Application Data

(60) Provisional application No. 62/336,787, filed on May 16, 2016.

(51) Int. Cl.
*B32B 37/12* (2006.01)
*C09J 7/40* (2018.01)
(Continued)

(52) U.S. Cl.
CPC ............ *C09J 7/401* (2018.01); *B32B 37/12* (2013.01); *C09D 183/04* (2013.01); *C09D 183/14* (2013.01); *C09J 5/00* (2013.01); *C09J 7/38* (2018.01); *H01L 21/6836* (2013.01); *B32B 2457/20* (2013.01); *C08G 77/12* (2013.01);
(Continued)

(58) Field of Classification Search
CPC ...... C09J 7/401; C09J 7/38; C09J 5/00; B32B 37/12; C09D 183/04; C09D 183/14
See application file for complete search history.

(56) References Cited

U.S. PATENT DOCUMENTS

| | | | |
|---|---|---|---|
| 2008/0090380 A1* | 4/2008 | Gardner | C09J 183/04 438/455 |
| 2012/0219794 A1* | 8/2012 | Seth | C09D 183/08 428/352 |

(Continued)

FOREIGN PATENT DOCUMENTS

WO   2005048669   5/2005

*Primary Examiner* — Daniel McNally

(57) ABSTRACT

Various embodiments disclosed related to a release layer including at least one fluorosilicon compound, and to related aspects such as methods for display device substrate processing. In various embodiments is a method of processing a display device substrate. The method can include securing the display device substrate to a carrier substrate with an adhesive delamination layer and a release layer between the adhesive delamination layer and the display device substrate. The release layer includes a cured product of a precursor release layer composition. The precursor release layer composition includes at least one fluorosilicon compound.

16 Claims, 1 Drawing Sheet

(51) Int. Cl.
- *C09D 183/14* (2006.01)
- *C09D 183/04* (2006.01)
- *C09J 7/38* (2018.01)
- *C09J 5/00* (2006.01)
- *H01L 21/683* (2006.01)
- *C08G 77/12* (2006.01)
- *C08G 77/20* (2006.01)

(52) U.S. Cl.
CPC ......... *C08G 77/20* (2013.01); *C09J 2203/318* (2013.01); *C09J 2203/326* (2013.01); *C09J 2427/005* (2013.01); *C09J 2483/00* (2013.01); *C09J 2483/005* (2013.01)

(56) References Cited

U.S. PATENT DOCUMENTS

| | | |
|---|---|---|
| 2012/0328863 A1 | 12/2012 | Kuo |
| 2013/0201635 A1 | 8/2013 | Xu |
| 2013/0288058 A1* | 10/2013 | Hong ................ C08G 18/4837 428/414 |
| 2014/0170378 A1 | 6/2014 | Bellman et al. |

* cited by examiner

RELEASE LAYER INCLUDING AT LEAST ONE FLUOROSILICON COMPOUND

This application is a U.S. national stage filing under 35 U.S.C. § 371 of PCT Application No. PCT/US2017/031860 filed on 10 May 2017, currently pending, which claims the benefit of U.S. Provisional Patent Application No. 62/336,787 filed 16 May 2016 under 35 U.S.C. § 119 (e). PCT Application No. PCT/US2017/031860 and U.S. Provisional Patent Application No. 62/336,787 are hereby incorporated by reference.

TECHNICAL FIELD

This invention generally relates to a release layer including at least one fluorosilicon compound, and related aspects including a method of processing a display device substrate and to a display device processing intermediate.

BACKGROUND OF THE RELATED ART

In the production of display devices such as liquid crystal displays (LCD), light emitting diode (LED) displays, and organic light emitting diode (OLED) displays, a variety of display device components are manufactured from thin display device substrates, including flexible and non-flexible glass and non-glass substrates. It can be challenging to perform manufacturing processes on some thin display device substrates due to their fragile nature, the high degree of precision required during certain manufacturing processes, and due to the harsh conditions of certain manufacturing processes (e.g., high temperatures).

SUMMARY OF THE INVENTION

A method of processing a display device substrate. Embodiments of the method include securing the display device substrate to a carrier substrate with an adhesive delamination layer and a release layer between the adhesive delamination layer and the display device substrate. The release layer includes a cured product of curing a precursor release layer composition. The precursor release layer composition is curable and includes at least one fluorosilicon compound.

A display device processing intermediate. Embodiments of the display device processing intermediate include a carrier substrate and an adhesive delamination layer on the carrier substrate. The display device processing intermediate also includes a display device substrate secured to the carrier substrate via the adhesive delamination layer. The display device processing intermediate also includes a release layer between the adhesive delamination layer and the display device substrate. The release layer includes a cured product of curing a precursor release layer composition. The precursor release layer composition is curable and includes at least one fluorosilicon compound.

BRIEF DESCRIPTION OF THE FIGURES

The drawings illustrate generally, by way of example, but not by way of limitation, various embodiments discussed in the present document.

DETAILED DESCRIPTION OF THE INVENTION

Figure 1:
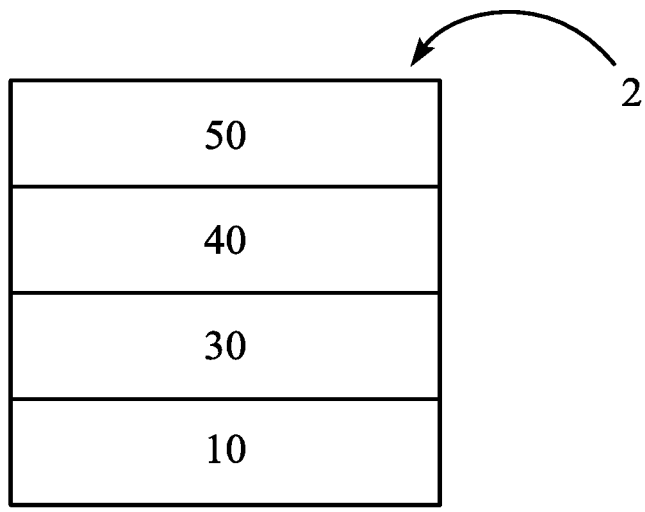
FIG. 1 illustrates a display device processing intermediate, in accordance with various embodiments.

The Brief Summary and Abstract are incorporated here by reference.

The following exemplary embodiments are provided, the numbering of which is not to be construed as designating levels of importance:

Embodiment 1 is a method of processing a display device substrate, the method comprising: securing the display device substrate to a carrier substrate with an adhesive delamination layer and a release layer between the adhesive delamination layer and the display device substrate, wherein the release layer comprises a cured product of a precursor release layer composition comprising at least one fluorosilicon compound.

Embodiment 2 is the method of Embodiment 1, wherein the display device substrate comprises glass, silicon, ceramic, plastic, metal, or a combination thereof.

Embodiment 3 is the method of any one of Embodiments 1-2, wherein the display device substrate comprises a processing precursor component of at least one of a light-emitting diode display (LED), an electroluminescent display (ELD), an electronic paper display, a plasma display panel (PDP), a liquid crystal display (LCD), a high-performance addressing display (HPA), thin-film transistor display (TFT), organic light-emitting diode display (OLED), surface-conduction electron-emitter display (SED), a laser TV display, a carbon nanotubes display, a quantum dot display, and an interferometric modulator display (IMOD).

Embodiment 4 is the method of any one of Embodiments 1-3, wherein the display device substrate has a thickness of 1 nm to 5 mm.

Embodiment 5 is the method of any one of Embodiments 1-4, wherein the display device substrate has a thickness of 1 nm to 0.5 mm.

Embodiment 6 is the method of any one of Embodiments 1-5, wherein the carrier substrate comprises glass, silicon, ceramic, plastic, metal, or a combination thereof.

Embodiment 7 is the method of any one of Embodiments 1-6, wherein securing the display device substrate to the carrier substrate with the adhesive delamination layer comprises securing the display device substrate to the adhesive delamination layer via a release layer.

Embodiment 8 is the method of any one of Embodiments 1-7, wherein securing the display device substrate to the carrier substrate with the adhesive delamination layer comprises securing the display device substrate to the release layer, wherein the release layer is bonded to the adhesive delamination layer which is in turn bonded to the carrier substrate.

Embodiment 9 is the method of any one of Embodiments 1-8, wherein securing the display device substrate to the carrier substrate with the adhesive delamination layer comprises securing the release layer to the adhesive delamination layer, wherein the release layer is bonded to the display device substrate and wherein the adhesive delamination layer is bonded to the carrier substrate.

Embodiment 10 is the method of any one of Embodiments 1-9, wherein the securing provides a display device processing intermediate wherein the release layer is between the adhesive delamination layer and the display device substrate.

Embodiment 11 is the method of any one of Embodiments 1-10, wherein the release layer has a thickness of 0.0001 μm to 500 μm.

Embodiment 12 is the method of any one of Embodiments 1-11, wherein no intervening layers occur between the adhesive delamination layer and the release layer or between the release layer and the display device substrate.

Embodiment 13 is the method of any one of Embodiments 1-12, wherein the fluorosilicon compound in the release layer precursor composition is at least one of a fluorosilane, a fluorosilazane, a fluorosiloxane, a fluoroorganosilane, a fluoroorganosiloxane, a fluorinated silicon resin, and a fluorinated silsesquioxane resin.

Embodiment 14 is the method of any one of Embodiments 1-13, wherein the release layer composition comprises a fluoroorganosilane being of formula $R^N SiZ_3$, wherein each Z is independently a hydrolyzable group that is H, a halogen atom, or an organoheteryl group, wherein the organoheteryl group is bonded to the Si atom in the formula $R^N SiZ_3$ via a heteroatom that is O, N, or S; alternatively O or N; alternatively O; alternatively N. In some embodiments each organoheteryl group is independently —$OR^M$, —$NHR^M$, —$NR^M_2$, —$O_2CR^M$, —O—N=$CR^M_2$, —O—C(=$CR^M_2$)$R^M$, or —N($R^M$)$COR^M$. In some embodiments the release layer composition comprises a fluoroorganosilane being of formula $R^N Si(OR^M)_3$. At each occurrence $R^M$ is independently selected from a substituted or unsubstituted ($C_1$-$C_{22}$)hydrocarbyl, a substituted or unsubstituted ($C_1$-$C_{22}$)alkyl, alternatively a substituted or unsubstituted ($C_1$-$C_5$)alkyl, or wherein any two $R^M$ bonded to the same N or C may be bonded to each other to form a bivalent group —$R^{Ma}$—$R^{Mb}$—, which is a substituted or unsubstituted ($C_1$-$C_{22}$) alkane-diyl. Each $R^N$ is independently a fluoro($C_1$-$C_{200}$) alkyl that is otherwise unsubstituted or is further substituted and is uninterrupted or interrupted by 1, 2, or 3 groups independently chosen from —O—, —S—, —(O—($C_2$-$C_3$) alkylene)$_n$- wherein n is 1 to 1,000, —(O-perfluoro($C_2$-$C_3$)alkylene)$_n$-, —(O-fluoro($C_2$-$C_3$)alkylene)$_n$-, —Si(($C_1$-$C_5$)alkoxy)$_2$-, —Si(perfluoro($C_1$-$C_5$)alkoxy)$_2$-, —Si(fluoro($C_1$-$C_5$)alkoxy)$_2$-, —Si(($C_1$-$C_5$)alkyl)$_2$-, Si(fluoro($C_1$-$C_5$) alkyl)$_2$-, and —Si(perfluoro($C_1$-$C_5$)alkyl)$_2$-. In some embodiments the organoheteryl group is a ($C_1$-$C_{20}$)organoheteryl group.

Embodiment 15 is the method of Embodiment 14, wherein the fluoroorganosilane is of formula

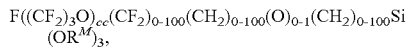
$F((CF_2)_3O)_{cc}(CF_2)_{0-100}(CH_2)_{0-100}(O)_{0-1}(CH_2)_{0-100}Si(OR^M)_3$, wherein cc is from 0 to 200 and $R^M$ is as defined in any ad rem embodiment herein (e.g., Embodiment 14).

Embodiment 16 is the method of any one of Embodiments 14-15, wherein the fluoroorganosilane is of formula

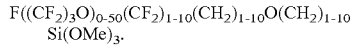
$F((CF_2)_3O)_{0-50}(CF_2)_{1-10}(CH_2)_{1-10}O(CH_2)_{1-10}Si(OMe)_3$.

Embodiment 17 is the method of any one of Embodiments 14-16, wherein the fluoroorganosilane is of formula

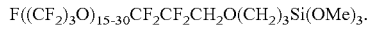
$F((CF_2)_3O)_{15-30}CF_2CF_2CH_2O(CH_2)_3Si(OMe)_3$.

Embodiment 18 is the method of any one of Embodiments 14-17, wherein the fluoroorganosilane is of formula

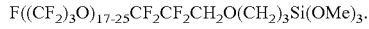
$F((CF_2)_3O)_{17-25}CF_2CF_2CH_2O(CH_2)_3Si(OMe)_3$.

Embodiment 19 is the method of any one of Embodiments 1-18, wherein the precursor release layer composition comprises: Component (A), a hydrogenorganopolysiloxane; and Component (B), a ($C_2$-$C_{20}$)alkenyl-functionalized organopolysiloxane, wherein the ($C_2$-$C_{20}$)alkenyl group is uninterrupted or interrupted by 1, 2, or 3 groups independently chosen from —O—, —S—, substituted or unsubstituted —NH—, —(O—($C_2$-$C_3$)alkylene)$_n$- wherein n is 1 to 1,000, —Si(($C_1$-$C_5$)alkoxy)$_2$-, and —Si(($C_1$-$C_5$)alkyl)$_2$-; wherein at least one of Component (A) and Component (B) is a fluoroorganopolysiloxane.

Embodiment 20 is the method of any one of Embodiments 1-19, wherein the precursor release layer composition comprises at least one of a linear Si—H-functional fluoroorganopolysiloxane, a non-linear Si—H-functional fluoroorganopolysiloxane, a linear ($C_2$-$C_{20}$)alkenyl-functional fluoroorganopolysiloxane, and a non-linear ($C_2$-$C_{20}$)alkenyl-functional fluoroorganopolysiloxane.

Embodiment 21 is the method of any one of Embodiments 1-20, wherein 0.1 wt % to 99 wt % of the precursor adhesive composition is at least one of a linear Si—H-functional fluoroorganopolysiloxane and a non-linear Si—H-functional fluoroorganopolysiloxane. In some embodiments, the 0.1 to 99 wt % is the linear Si—H-functional fluoroorganosiloxane. In other embodiments the 0.1 to 99 wt % is the non-linear Si—H-functional fluoroorganopolysiloxane. In other embodiments the 0.1 to 99 wt % is sum of the linear Si—H-functional fluoroorganosiloxane and non-linear Si—H-functional fluoroorganopolysiloxane.

Embodiment 22 is the method of any one of Embodiments 1-21, wherein 0.2 wt % to 40 wt % of the precursor adhesive composition is at least one of a linear Si—H-functional fluoroorganopolysiloxane and a non-linear Si—H-functional fluoroorganopolysiloxane. In some embodiments, the 0.2 to 40 wt % is the linear Si—H-functional fluoroorganosiloxane. In other embodiments the 0.2 to 40 wt % is the non-linear Si—H-functional fluoroorganopolysiloxane. In other embodiments the 0.2 to 40 wt % is the sum of the linear Si—H-functional fluoroorganosiloxane and non-linear Si—H-functional fluoroorganopolysiloxane.

Embodiment 23 is the method of any one of Embodiments 1-22, wherein the precursor release layer composition comprises a non-linear Si—H-functional fluoroorganopolysiloxane being of formula:

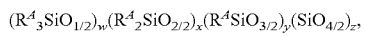
$(R^A_3SiO_{1/2})_w(R^A_2SiO_{2/2})_x(R^A SiO_{3/2})_y(SiO_{4/2})_z$, wherein at each occurrence, $R^A$ is independently selected from H, $R^1$, and $R^f$, at least one $R^A$ in the non-linear Si—H-functional fluoroorganopolysiloxane is H, at least one $R^A$ in the non-linear Si—H-functional fluoroorganopolysiloxane is $R^f$ at each occurrence $R^1$ is independently a substituted or unsubstituted ($C_1$-$C_{20}$)hydrocarbyl uninterrupted or interrupted by 1, 2, or 3 groups chosen from —O—, —S—, substituted or unsubstituted —NH—, —Si(($C_1$-$C_5$)alkoxy)$_2$-, and —Si(($C_1$-$C_5$)alkyl)$_2$-, at each occurrence $R^f$ is independently a fluoro($C_m$)alkyl that is otherwise unsubstituted or is further substituted and has 1 to 2m+1 fluorine groups wherein m is independently 1 to 20, wherein the ($C_m$)alkyl group is uninterrupted or interrupted by 1, 2, or 3 groups independently chosen from —O—, —S—, substituted or unsubstituted —NH—, —(O—($C_2$-$C_3$)alkylene)$_n$- wherein n is 1 to 1,000, —Si(($C_1$-$C_5$)alkoxy)$_2$-, and —Si(($C_1$-$C_5$)alkyl)$_2$-, y and z are independently 0 to 5,000, at least one of y and z is greater than 0, and w is 1 to 1,000 and x is 0 to 5,000.

Embodiment 24 is the method of Embodiment 23, wherein $R^1$ is a ($C_1$-$C_{20}$)hydrocarbyl.

Embodiment 25 is the method of any one of Embodiments 23-24, wherein $R^1$ is a ($C_1$-$C_5$)alkyl.

Embodiment 26 is the method of any one of Embodiments 23-25, wherein $R^1$ is methyl.

Embodiment 27 is the method of any one of Embodiments 23-26, wherein $R^f$ is a fluoro($C_m$)alkyl that is otherwise unsubstituted or is further substituted and has 1 to 2m+1 fluorine groups wherein m is independently 1 to 20.

Embodiment 28 is the method of any one of Embodiments 23-27, wherein $R^f$ is (perfluoro$(C_1-C_{10})$alkyl)$(C_1-C_{10})$alkyl.

Embodiment 29 is the method of any one of Embodiments 23-28, wherein $R^f$ is (perfluorobutyl)ethyl.

Embodiment 30 is the method of any one of Embodiments 1-29, wherein the precursor release layer composition comprises a linear Si—H-functional fluoroorganopolysiloxane being of formula:

$$(R^A{}_3SiO_{1/2})_2(R^A{}_2SiO_{2/2})_x,$$

wherein at each occurrence, $R^A$ is independently as defined in any ad rem embodiment herein (e.g., Embodiment 23).

Embodiment 31 is the method of Embodiment 30, wherein $R^1$ is a $(C_1-C_{20})$hydrocarbyl.

Embodiment 32 is the method of any one of Embodiments 30-31, wherein $R^1$ is a $(C_1-C_5)$alkyl.

Embodiment 33 is the method of any one of Embodiments 30-32, wherein $R^1$ is methyl.

Embodiment 34 is the method of any one of Embodiments 30-33, wherein x is 1 to 200.

Embodiment 35 is the method of any one of Embodiments 30-34, wherein $R^f$ is a fluoro$(C_m)$alkyl that is otherwise unsubstituted or is further substituted and has 1 to 2m+1 fluorine groups wherein m is independently 1 to 20.

Embodiment 36 is the method of any one of Embodiments 30-35, wherein $R^f$ is (perfluoro$(C_1-C_{10})$alkyl)$(C_1-C_{10})$alkyl.

Embodiment 37 is the method of any one of Embodiments 30-36, wherein $R^f$ is (perfluorobutyl)ethyl.

Embodiment 38 is the method of any one of Embodiments 30-37, wherein the linear Si—H-functional fluoroorganopolysiloxane is of formula:

$$(R^1{}_3SiO_{1/2})_2(R^fR^1SiO_{2/2})_X(HR^1SiO_{2/2})_X.$$

At each occurrence $R^1$ is independently a substituted or unsubstituted $(C_1-C_{20})$hydrocarbyl uninterrupted or interrupted by 1, 2, or 3 groups chosen from —O—, —S—, substituted or unsubstituted —NH—, —Si$((C_1-C_5)$alkoxy$)_2$-, and —Si$((C_1-C_5)$alkyl$)_2$-. At each occurrence $R^f$ is independently a fluoro$(C_m)$alkyl that is otherwise unsubstituted or is further substituted and has 1 to 2m+1 fluorine groups wherein m is independently 1 to 20, wherein the $(C_m)$alkyl group is uninterrupted or interrupted by 1, 2, or 3 groups independently chosen from —O—, —S—, substituted or unsubstituted —NH—, —(O—$(C_2-C_3)$alkylene$)_n$- wherein n is 1 to 1,000, —Si$((C_1-C_5)$alkoxy$)_2$-, and —Si$((C_1-C_5)$alkyl$)_2$-. Subscript X is from 1 to 5,000.

Embodiment 39 is the method of any one of Embodiments 30-38, wherein the linear Si—H-functional fluoroorganopolysiloxane is of formula:

$$(Me_3SiO_{1/2})_2(R^fMeSiO_{2/2})_{1-200}(HMeSiO_{2/2})_{1-400},$$

wherein $R^f$ is as defined in any ad rem embodiment herein (e.g., Embodiment 23 or 38).

Embodiment 40 is the method of any one of Embodiments 30-39, wherein the linear Si—H-functional fluoroorganopolysiloxane is of formula:

$$(Me_3SiO_{1/2})_2(R^fMeSiO_{2/2})_{5-20}(HMeSiO_{2/2})_{10-40},$$

wherein $R^f$ is as defined in any ad rem embodiment herein (e.g., Embodiment 23 or 38).

Embodiment 41 is the method of any one of Embodiments 1-40, wherein 1 wt % to 99.9 wt % of the precursor adhesive composition is at least one of a linear $(C_2-C_{20})$alkenyl-functional fluoroorganopolysiloxane and a non-linear $(C_2-C_{20})$alkenyl-functional fluoroorganopolysiloxane.

Embodiment 42 is the method of any one of Embodiments 1-41, wherein 40 wt % to 99.9 wt % of the precursor adhesive composition is at least one of a linear $(C_2-C_{20})$alkenyl-functional fluoroorganopolysiloxane and a non-linear $(C_2-C_{20})$alkenyl-functional fluoroorganopolysiloxane.

Embodiment 43 is the method of any one of Embodiments 1-42, wherein the precursor release layer composition comprises a non-linear $(C_2-C_{20})$alkenyl-functional fluoroorganopolysiloxane being of formula:

$$(R^B{}_3SiO_{1/2})_w(R^B{}_2SiO_{2/2})_x(R^BSiO_{3/2})_y(SiO_{4/2})_z.$$

At each occurrence, $R^B$ is independently selected from $R^1$, $R^2$, and $R^f$, wherein at least one $R^B$ in the non-linear $(C_2-C_{20})$alkenyl-functional fluoroorganopolysiloxane is $R^2$ and at least one $R^B$ in the non-linear $(C_2-C_{20})$alkenyl-functional fluoroorganopolysiloxane is $R^f$. At each occurrence $R^1$ is independently a substituted or unsubstituted $(C_1-C_{20})$hydrocarbyl uninterrupted or interrupted by 1, 2, or 3 groups chosen from —O—, —S—, substituted or unsubstituted —NH—, —Si$((C_1-C_5)$alkoxy$)_2$-, and —Si$((C_1-C_5)$alkyl$)_2$-. At each occurrence $R^2$ is independently a substituted or unsubstituted $(C_2-C_{20})$alkenyl uninterrupted or interrupted by 1, 2, or 3 groups chosen from —O—, —S—, substituted or unsubstituted —NH—, —(O—$(C_2-C_3)$alkylene$)_n$- wherein n is 1 to 1,000, —Si$((C_1-C_5)$alkoxy$)_2$-, and —Si$((C_1-C_5)$alkyl$)_2$-. At each occurrence $R^f$ is independently a fluoro$(C_m)$alkyl that is otherwise unsubstituted or is further substituted and has 1 to 2m+1 fluorine groups wherein m is independently 1 to 20, wherein the $(C_m)$alkyl group is uninterrupted or interrupted by 1, 2, or 3 groups independently chosen from —O—, —S—, substituted or unsubstituted —NH—, —(O—$(C_2-C_3)$alkylene$)_n$- wherein n is 1 to 1,000, —Si$((C_1-C_5)$alkoxy$)_2$-, and —Si$((C_1-C_5)$alkyl$)_2$-, y and z are independently 0 to 5,000, at least one of y and z is greater than 0, and w is 1 to 1,000 and x is 0 to 5,000.

Embodiment 44 is the method of Embodiment 43, wherein $R^1$ is a $(C_1-C_{20})$hydrocarbyl.

Embodiment 45 is the method of any one of Embodiments 43-44, wherein $R^1$ is a $(C_1-C_5)$alkyl.

Embodiment 46 is the method of any one of Embodiments 43-45, wherein $R^1$ is methyl.

Embodiment 47 is the method of any one of Embodiments 43-46, wherein $R^2$ is a $(C_2-C_{20})$alkenyl.

Embodiment 48 is the method of any one of Embodiments 43-47, wherein $R^2$ is a vinyl group.

Embodiment 49 is the method of any one of Embodiments 43-48, wherein at least one $R^B$ in Component (B) is $R^f$, wherein $R^f$ is as defined in any ad rem embodiment herein.

Embodiment 50 is the method of any one of Embodiments 43-49, wherein $R^f$ is a fluoro$(C_m)$alkyl that is otherwise unsubstituted or is further substituted and has 1 to 2m+1 fluorine groups wherein m is independently 1 to 20.

Embodiment 51 is the method of any one of Embodiments 43-50, wherein $R^f$ is (perfluoro$(C_1-C_{10})$alkyl)$(C_1-C_{10})$alkyl.

Embodiment 52 is the method of any one of Embodiments 43-51, wherein $R^f$ is (perfluorobutyl)ethyl.

Embodiment 53 is the method of any one of Embodiments 1-52, wherein the release layer precursor composition comprises a linear $(C_2-C_{20})$alkenyl-functional fluoroorganopolysiloxane being of formula:

$$(R^B{}_3SiO_{1/2})_2(R^B{}_2SiO_{2/2})_x,$$

wherein each $R^B$ is as defined in any ad rem embodiment herein (e.g., Embodiment 43).

Embodiment 54 is the method of Embodiment 53, wherein $R^1$ is a $(C_1-C_{20})$hydrocarbyl.

Embodiment 55 is the method of any one of Embodiments 53-54, wherein $R^1$ is a $(C_1-C_5)$alkyl.

Embodiment 56 is the method of any one of Embodiments 53-55, wherein $R^1$ is methyl.

Embodiment 57 is the method of any one of Embodiments 53-56, wherein $R^2$ is a $(C_2-C_{20})$alkenyl.

Embodiment 58 is the method of any one of Embodiments 53-57, wherein $R^2$ is a vinyl group.

Embodiment 59 is the method of any one of Embodiments 53-58, wherein at least one $R^B$ in Component (B) is $R^f$, wherein $R^f$ is as defined in any ad rem embodiment herein (e.g., Embodiment 23, 38, or 43).

Embodiment 60 is the method of any one of Embodiments 53-59, wherein $R^f$ is a fluoro$(C_m)$alkyl that is otherwise unsubstituted or is further substituted and has 1 to 2m+1 fluorine groups wherein m is independently 1 to 20.

Embodiment 61 is the method of any one of Embodiments 53-60, wherein $R^f$ is (perfluoro$(C_1-C_{10})$alkyl)$(C_1-C_{10})$alkyl.

Embodiment 62 is the method of any one of Embodiments 53-61, wherein $R^f$ is (perfluorobutyl)ethyl.

Embodiment 63 is the method of any one of Embodiments 53-62, wherein the linear $(C_2-C_{20})$alkenyl-functional fluoroorganopolysiloxane is of formula:

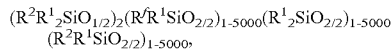
$(R^2R^1{}_2SiO_{1/2})_2(R^fR^1SiO_{2/2})_{1-5000}(R^1{}_2SiO_{2/2})_{1-5000}$
$(R^2R^1SiO_{2/2})_{1-5000}$, wherein $R^1$, $R^2$, $R^f$ are as defined in any ad rem embodiment herein (e.g., Embodiment 43).

Embodiment 64 is the method of any one of Embodiments 53-63, wherein the linear $(C_2-C_{20})$alkenyl-functional fluoroorganopolysiloxane is of formula:

$(ViMe_2SiO_{1/2})_2(R^fMeSiO_{2/2})_{100-2000}$
$(Me_2SiO_{2/2})_{100-3000}(ViMeSiO_{2/2})_{1-100}$, wherein $R^f$ is as defined in any ad rem embodiment herein (e.g., Embodiment 23, 38, or 43).

Embodiment 65 is the method of any one of Embodiments 53-64, wherein the linear $(C_2-C_{20})$alkenyl-functional fluoroorganopolysiloxane is of formula:

$(ViMe_2SiO_{1/2})_2(R^fMeSiO_{2/2})_{300-600}$
$(Me_2SiO_{2/2})_{800-1000}(ViMeSiO_{2/2})_{5-15}$, wherein $R^f$ is as defined in any ad rem embodiment herein (e.g., Embodiment 23, 38, or 43).

Embodiment 66 is the method of any one of Embodiments 1-65, wherein the precursor release layer composition comprises a linear Si—H-functional fluoroorganopolysiloxane being of formula:

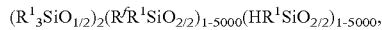
$(R^1{}_3SiO_{1/2})_2(R^fR^1SiO_{2/2})_{1-5000}(HR^1SiO_{2/2})_{1-5000}$, and the precursor release layer precursor composition comprises a linear $(C_2-C_{20})$alkenyl-functional fluoroorganopolysiloxane being of formula:

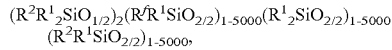
$(R^2R^1{}_2SiO_{1/2})_2(R^fR^1SiO_{2/2})_{1-5000}(R^1{}_2SiO_{2/2})_{1-5000}$
$(R^2R^1SiO_{2/2})_{1-5000}$, wherein $R^1$, $R^2$, and $R^f$ are as defined in any ad rem embodiment herein (e.g., Embodiment 43).

Embodiment 67 is the method of any one of Embodiments 1-66, wherein the precursor release layer composition comprises a linear Si—H-functional fluoroorganopolysiloxane being of formula:

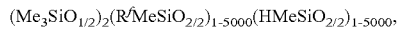
$(Me_3SiO_{1/2})_2(R^fMeSiO_{2/2})_{1-5000}(HMeSiO_{2/2})_{1-5000}$, and the precursor release layer precursor composition comprises a linear $(C_2-C_{20})$alkenyl-functional fluoroorganopolysiloxane being of formula:

$(ViMe_2SiO_{1/2})_2(R^fMeSiO_{2/2})_{100-2000}$
$(Me_2SiO_{2/2})_{100-3000}(ViMeSiO_{2/2})_{1-100}$, wherein at each occurrence $R^f$ is as defined in any ad rem embodiment herein.

Embodiment 68 is the method of any one of Embodiments 1-67, wherein the precursor release layer composition comprises a linear Si—H-functional fluoroorganopolysiloxane being of formula:

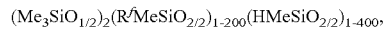
$(Me_3SiO_{1/2})_2(R^fMeSiO_{2/2})_{1-200}(HMeSiO_{2/2})_{1-400}$, and the precursor release layer precursor composition comprises a linear $(C_2-C_{20})$alkenyl-functional fluoroorganopolysiloxane being of formula:

$(ViMe_2SiO_{1/2})_2(R^fMeSiO_{2/2})_{300-600}$
$(Me_2SiO_{2/2})_{800-1000}(ViMeSiO_{2/2})_{5-15}$, wherein at each occurrence $R^f$ is as defined in any ad rem embodiment herein (e.g., Embodiment 23, 38, or 43).

Embodiment 69 is the method of any one of Embodiments 1-68, wherein the precursor release layer composition further comprises a hydrogensilsesquioxane-$(C_1-C_{20})$hydrocarbylsilsesquioxane copolymer, wherein the $(C_1-C_{20})$hydrocarbyl is substituted or unsubstituted and is uninterrupted or interrupted by 1, 2, or 3 groups independently chosen from —O—, —S—, substituted or unsubstituted —NH—, —(O—$(C_2-C_3)$alkylene)$_n$- wherein n is 1 to 1,000, —Si$((C_1-C_5)$alkoxy)$_2$-, and —Si$((C_1-C_5)$alkyl)$_2$-.

Embodiment 70 is the method of Embodiment 69, wherein the hydrogensilsesquioxane-$(C_1-C_{20})$hydrocarbylsilsesquioxane copolymer is of formula:

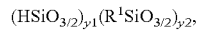
$(HSiO_{3/2})_{y1}(R^1SiO_{3/2})_{y2}$, wherein the unit subscripts indicate mole ratios thereof, $R^1$ is independently a substituted or unsubstituted $(C_1-C_{20})$ hydrocarbyl uninterrupted or interrupted by 1, 2, or 3 groups chosen from —O—, —S—, substituted or unsubstituted —NH—, —Si$((C_1-C_5)$alkoxy)$_2$-, and —Si$((C_1-C_5)$alkyl)$_2$-, mole ratio y1 is 0.001 to 5, and mole ratio y2 is 0.001 to 5.

Embodiment 71 is the method of Embodiment 70, wherein mole ratio y1 is 0.001 to 1.5.

Embodiment 72 is the method of any one of Embodiments 70-71, wherein mole ratio y1 is 0.01 to 0.5.

Embodiment 73 is the method of any one of Embodiments 70-72, wherein mole ratio y2 is 0.1 to 1.5.

Embodiment 74 is the method of any one of Embodiments 70-73, wherein mole ratio y2 is 0.5 to 1.

Embodiment 75 is the method of any one of Embodiments 70-74, wherein $R^1$ is a substituted or unsubstituted $(C_1-C_{20})$ hydrocarbyl.

Embodiment 76 is the method of any one of Embodiments 70-75, wherein $R^1$ is a substituted or unsubstituted $(C_1-C_{10})$ alkyl.

Embodiment 77 is the method of any one of Embodiments 70-76, wherein $R^1$ is a substituted or unsubstituted $(C_1-C_5)$ alkyl.

Embodiment 78 is the method of any one of Embodiments 70-77, wherein $R^1$ is methyl.

Embodiment 79 is the method of any one of Embodiments 70-78, wherein $R^1$ is a substituted or unsubstituted $(C_6-C_{20})$ aryl.

Embodiment 80 is the method of any one of Embodiments 70-79, wherein $R^1$ is a $(C_6-C_{20})$aryl.

Embodiment 81 is the method of any one of Embodiments 70-80, wherein $R^1$ is a substituted or unsubstituted phenyl.

Embodiment 82 is the method of any one of Embodiments 70-81, wherein $R^1$ is phenyl.

Embodiment 83 is the method of any one of Embodiments 70-82, wherein the hydrogensilsesquioxane-$(C_1-C_{20})$hydrocarbylsilsesquioxane copolymer is of formula:

$$(HSiO_{3/2})_{0.01-0.5}(MeSiO_{3/2})_{0.5-1},$$

wherein the unit subscripts indicate mole ratios thereof.

Embodiment 84 is the method of any one of Embodiments 70-83, wherein the hydrogensilsesquioxane—$(C_1-C_{20})$hydrocarbylsilsesquioxane copolymer is of formula:

$$(HSiO_{3/2})_{0.01-0.5}(PhSiO_{3/2})_{0.5-1},$$

wherein the unit subscripts indicate mole ratios thereof.

Embodiment 85 is the method of any one of Embodiments 1-84, wherein the precursor release layer composition has an Si—H to alkenyl ratio of 0.1:1 to 10:1.

Embodiment 86 is the method of any one of Embodiments 1-85, wherein the precursor release layer composition has an Si—H to alkenyl ratio of 0.7:1 to 2:1.

Embodiment 87 is the method of any one of Embodiments 1-86, wherein the adhesive delamination layer comprises a cured product of a precursor adhesive composition.

Embodiment 88 is the method of Embodiment 87, wherein the precursor adhesive composition comprises at least one of a thermoplastic material, a thermoset material, a monomer, an oligomer, a polymer, a crosslinkable polymer, a crosslinked polymer, a rubber, a polyurethane, a polyisobutylene, a silane, an organosilane, a siloxane, an organosiloxane, a fluorosilicone, a fluorosilane, a fluoroorganosilane, a shellac, a polyamide, a silyl-modified polyamide, a polyester, a polycarbonate, a polycarbamate, a urethane, a natural adhesive, an epoxy-based adhesive, a furan-based adhesive, a phenolic-based adhesive, an aldehyde-based adhesive, a urea-aldehyde adhesive, an acrylic acid-based adhesive, a phenol/phenol formaldehyde/furfuryl alcohol adhesive, a curing agent, a catalyst, a precursor that is curable to form of any one of the same, and a reaction product of any one of the same.

Embodiment 89 is the method of any one of Embodiments 87-88, wherein the precursor adhesive composition comprises at least one of an organohydrogensilane, an organohydrogensiloxane, an organoalkenylsilane, and an organoalkenylsiloxane.

Embodiment 90 is the method of any one of Embodiments 87-89, wherein the precursor adhesive composition comprises at least one of a non-linear $(C_2-C_{20})$alkenyl-functionalized organopolysiloxane, a linear $(C_2-C_{20})$alkenyl-functionalized organopolysiloxane, a linear $(C_2-C_{20})$alkenyl-functionalized fluoro$(C_1-C_{20})$alkyl-substituted organopolysiloxane, a non-linear hydrogenorganopolysiloxane, a linear hydrogenorganopolysiloxane, and a $((C_1-C_{20})$hydrocarbyl)hydrogensilsesquioxane, wherein the $(C_2-C_{20})$ alkenyl group and $(C_1-C_{20})$hydrocarbyl are independently selected, substituted or unsubstituted, and are uninterrupted or interrupted by 1, 2, or 3 groups independently chosen from —O—, —S—, substituted or unsubstituted —NH—, —O—$(C_2-C_3)$alkylene$)_n$- wherein n is 1 to 1,000, —Si$(C_1-C_5)$alkoxy$)_2$-, and —Si$((C_1-C_5)$alkyl$)_2$-.

Embodiment 91 is the method of any one of Embodiments 87-90, wherein the precursor adhesive composition comprises a linear hydrogenorganopolysiloxane being of formula:

$$(R^A{}_3SiO_{1/2})_2(R^A{}_2SiO_{2/2})_x,$$

wherein at each occurrence, $R^A$ is independently selected from H and $R^1$, at least one $R^A$ is H, at each occurrence $R^1$ is independently a substituted or unsubstituted $(C_1-C_{20})$ hydrocarbyl uninterrupted or interrupted by 1, 2, or 3 groups chosen from —O—, —S—, substituted or unsubstituted —NH—, —Si$((C_1-C_5)$alkoxy$)_2$-, and —Si$((C_1-C_5)$alkyl$)_2$-, x is 0 to 5,000.

Embodiment 92 is the method of Embodiment 91, wherein the linear hydrogenorganopolysiloxane is of formula:

$$(R^1{}_3SiO_{1/2})_2(R^1{}_2SiO_{2/2})_{1-5000}(HR^1SiO_{2/2})_{1-5000},$$

wherein $R^1$ is as defined above.

Embodiment 93 is the method of any one of Embodiments 91-92, wherein the linear hydrogenorganopolysiloxane is of formula:

$$(Me_3SiO_{1/2})_2(Me_2SiO_{2/2})_{1-100}(HMeSiO_{2/2})_{1-100}.$$

Embodiment 94 is the method of any one of Embodiments 91-93, wherein the linear hydrogenorganopolysiloxane is of formula:

$$(Me_3SiO_{1/2})_2(Me_2SiO_{2/2})_{3-4}(HMeSiO_{2/2})_{5-6}.$$

Embodiment 95 is the method of any one of Embodiments 87-94, wherein the precursor adhesive composition comprises a non-linear hydrogenorganopolysiloxane being of formula:

$$(R^A{}_3SiO_{1/2})_w(R^A{}_2SiO_{2/2})_x(R^ASiO_{3/2})_y(SiO_{4/2})_z,$$

wherein at each occurrence, $R^A$ is independently selected from H and $R^1$, at least one $R^A$ is H, at each occurrence $R^1$ is independently a substituted or unsubstituted $(C_1-C_{20})$ hydrocarbyl uninterrupted or interrupted by 1, 2, or 3 groups chosen from —O—, —S—, substituted or unsubstituted —NH—, —Si$((C_1-C_5)$alkoxy$)_2$-, and —Si$((C_1-C_5)$alkyl$)_2$-, y and z are independently 0 to 5,000, at least one of y and z is greater than 0, and w is 1 to 1,000 and x is 0 to 5,000.

Embodiment 96 is the method of any one of Embodiments 87-95, wherein the precursor adhesive composition comprises a linear $(C_2-C_{20})$alkenyl-functionalized organopolysiloxane being of formula:

$$(R^B{}_3SiO_{1/2})_2(R^B{}_2SiO_{2/2})_x,$$

wherein at each occurrence, $R^B$ is independently selected from $R^1$ and $R^2$, at least one $R^B$ is $R^2$, at each occurrence $R^1$ is independently a substituted or unsubstituted $(C_1-C_{20})$ hydrocarbyl uninterrupted or interrupted by 1, 2, or 3 groups chosen from —O—, —S—, substituted or unsubstituted —NH—, —Si$((C_1-C_5)$alkoxy$)_2$-, and —Si$((C_1-C_5)$alkyl$)_2$-, at each occurrence $R^2$ is independently a substituted or unsubstituted $(C_2-C_{20})$alkenyl uninterrupted or interrupted by 1, 2, or 3 groups chosen from —O—, —S—, substituted or unsubstituted —NH—, —(O—$(C_2-C_3)$alkylene$)_n$- wherein n is 1 to 1,000, —Si$((C_1-C_5)$alkoxy$)_2$-, and —Si$((C_1-C_5)$alkyl$)_2$-, and x is 0 to 5,000.

Embodiment 97 is the method of Embodiment 96, wherein the linear $(C_2-C_{20})$alkenyl-functionalized organopolysiloxane is of formula:

$$(R^2R^1{}_2SiO_{1/2})_2(R^1{}_2SiO_{2/2})_{1-5000},$$

wherein $R^1$ and $R^2$ are as defined above.

Embodiment 98 is the method of any one of Embodiments 96-97, wherein the linear $(C_2-C_{20})$alkenyl-functionalized organopolysiloxane is of formula:

$$(ViMe_2SiO_{1/2})_2(Me_2SiO_{2/2})_{100-3000}.$$

Embodiment 99 is the method of any one of Embodiments 96-98, wherein the linear $(C_2-C_{20})$alkenyl-functionalized organopolysiloxane is of formula:

$$(ViMe_2SiO_{1/2})_2(Me_2SiO_{2/2})_{600}.$$

Embodiment 100 is the method of any one of Embodiments 87-99, wherein the precursor adhesive composition comprises a non-linear (C$_2$-C$_{20}$)alkenyl-functionalized organopolysiloxane being of formula:

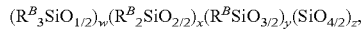
$(R^B{}_3SiO_{1/2})_w(R^B{}_2SiO_{2/2})_x(R^BSiO_{3/2})_y(SiO_{4/2})_z$, wherein at each occurrence, R$^B$ is independently selected from R$^1$ and R$^2$, at least one R$^B$ is R$^2$, at each occurrence R$^1$ is independently a substituted or unsubstituted (C$_1$-C$_{20}$) hydrocarbyl uninterrupted or interrupted by 1, 2, or 3 groups chosen from —O—, —S—, substituted or unsubstituted —NH—, —Si((C$_1$-C$_5$)alkoxy)$_2$-, and —Si((C$_1$-C$_5$)alkyl)$_2$-, at each occurrence R$^2$ is independently a substituted or unsubstituted (C$_2$-C$_{20}$)alkenyl uninterrupted or interrupted by 1, 2, or 3 groups chosen from —O—, —S—, substituted or unsubstituted —NH—, —(O—(C$_2$-C$_3$)alkylene)$_n$- wherein n is 1 to 1,000, —Si((C$_1$-C$_5$)alkoxy)$_2$-, and —Si ((C$_1$-C$_5$)alkyl)$_2$-, y and z are independently 0 to 5,000, at least one of y and z is greater than 0, and w is 1 to 1,000 and x is 0 to 5,000.

Embodiment 101 is the method of Embodiment 100, wherein the non-linear (C$_2$-C$_{20}$)alkenyl-functionalized organopolysiloxane is of formula:

$(R^2R^1{}_2SiO_{1/2})_{1-100}(R^1{}_3SiO_{1/2})_{1-100}(SiO_{4/2})_{1-500}$, wherein R$^1$ and R$^2$ are as defined above.

Embodiment 102 is the method of any one of Embodiments 100-101, wherein the non-linear (C$_2$-C$_{20}$)alkenyl-functionalized organopolysiloxane is of formula:

$(ViMe_2SiO_{1/2})_{5-20}(Me_3SiO_{1/2})_{10-50}(SiO_{4/2})_{20-80}$.

Embodiment 103 is the method of any one of Embodiments 100-102, wherein the non-linear (C$_2$-C$_{20}$)alkenyl-functionalized organopolysiloxane is of formula:

$((ViMe_2SiO_{1/2})_{11}(Me_3SiO_{1/2})_{34}(SiO_{4/2})_{55})$.

Embodiment 104 is the method of any one of Embodiments 87-103, wherein the precursor adhesive composition comprises at least one of $(R^2R^1{}_2SiO_{1/2})_{1-20}(R^1{}_2SiO_{2/2})_{10-300}$ $(SiO_{4/2})_{1-5}$, $(R^2R^1{}_2SiO_{1/2})_{1-100}(R^1{}_2SiO_{2/2})_{5-500}(SiO_{4/2})_{5-500}$, $(R^2R^1{}_2SiO_{1/2})_2(R^1{}_2SiO_{2/2})_{10-2000}$, $(R^2R^1{}_2SiO_{1/2})_2$ $(R^fR^1SiO_{2/2})_{10-5000}(R^1{}_2SiO_{2/2})_{10-5000}(R^2R^1SiO_{2/2})_{1-100}$, $(R^2R^1{}_2SiO_{1/2})_2(R^1{}_2SiO_{2/2})_{100-5000}$, $(R^1{}_3SiO_{1/2})_2(R^1{}_2SiO_{2/2})_{1-100}(HR^1SiO_{2/2})_{1-200}$, $(HR^1{}_2SiO_{1/2})_{0.1-10}$ $(SiO_{4/2})_{0.1-5}$ wherein the unit subscripts indicate mole ratios thereof, $(R^1{}_3SiO_{1/2})_2(R^fR^1SiO_{2/2})_{1-100}(HR^1SiO_{2/2})_{1-200}$, $(HR^1{}_2SiO_{1/2})_2(R^1{}_2SiO_{2/2})_{10-2000}$, and $(HSiO_{3/2})_{0.001-1}$ $(R^1SiO_{3/2})_{1.5-0.1}$ wherein the unit subscripts indicate mole ratios thereof, and wherein at each occurrence R$^1$ and R$^f$ are as defined in any ad rem embodiment herein (e.g., Embodiment 23, 38, or 43) and R2 is as defined in any ad rem embodiment herein (e.g., Embodiment 43, 96 or 100).

Embodiment 105 is the method of any one of Embodiments 87-104, wherein the precursor adhesive composition comprises at least one of $(R^2R^1{}_2SiO_{1/2})_{1-8}(R^1{}_2SiO_{2/2})_{60-180}$ $(SiO_{4/2})_{1-2}$, $(R^2R^1{}_2SiO_{1/2})_{5-20}(R^1{}_2SiO_{2/2})_{16-56}(SiO_{4/2})_{25-85}$, $(R^2R^1{}_2SiO_{1/2})_2(R^1{}_2SiO_{2/2})_{75-225}$, $(R^2R^1{}_2SiO_{1/2})_2(R^fR^1SiO_{2/2})_{100-800}(R^1{}_2SiO_{2/2})_{400-2000}(R^2R^1SiO_{2/2})_{2-30}$, $(R^2R^1{}_2SiO_{1/2})_2(R^1{}_2SiO_{2/2})_{400-1200}$, $(R^1{}_3SiO_{1/2})_2(R^1{}_2SiO_{2/2})_{1-6}$ $(HR^1SiO_{2/2})_{3-9}$, $(HR^1{}_2SiO_{1/2})_{1-2}(SiO_{4/2})_{0.5-1.5}$ wherein the unit subscripts indicate mole ratios thereof, $(R^1{}_3SiO_{1/2})_2$ $(R^fR^1SiO_{2/2})_{2-40}(HR^1SiO_{2/2})_{5-80}$, $(HR^1{}_2SiO_{1/2})_2(R^1{}_2SiO_{2/2})_{50-200}$, $(R^1{}_3SiO_{1/2})_2(R^1{}_2SiO_{2/2})_{2-40}(HR^1SiO_{2/2})_{5-80}$, and $(HSiO_{3/2})_{0.001-1}(R^1SiO_{3/2})_{1.5-0.1}$ wherein the unit subscripts indicate mole ratios thereof, wherein at each occurrence R$^1$ and R$^f$ are as defined in any ad rem embodiment herein (e.g., Embodiment 23, 38, or 43) and R2 is as defined in any ad rem embodiment herein (e.g., Embodiment 43, 96 or 100).

Embodiment 106 is the method of any one of Embodiments 87-105, wherein the precursor adhesive composition comprises at least one of $(R^2R^1{}_2SiO_{1/2})_4(R^1{}_2SiO_{2/2})_{120}$ $(SiO_{4/2})$, $(R^2R^1{}_2SiO_{1/2})_{11}(R^1{}_2SiO_{2/2})_{34}(SiO_{4/2})_{55}$, $(R^2R^1{}_2SiO_{1/2})_2(R^1{}_2SiO_{2/2})_{150}$, $(R^2R^1{}_2SiO_{1/2})(R^fR^1SiO_{2/2})_{300-600}(R^1{}_2SiO_{2/2})_{800-1000}(R^2R^1SiO_{2/2})_{5-15}$, $(R^2R^1{}_2SiO_{1/2})_2(R^1{}_2SiO_{2/2})_{600}$, $(R^1{}_3SiO_{1/2})_2(R^1{}_2SiO_{2/2})_{3-4}$ $(HR^1SiO_{2/2})_{5-6}$, $(HR^1{}_2SiO_{1/2})_{1.58}(SiO_{4/2})$ wherein the unit subscripts indicate mole ratios thereof, $(R^1{}_3SiO_{1/2})_2$ $(R^fR^1SiO_{2/2})_{5-20}(HR^1SiO_{2/2})_{10-40}$, $(HR^1{}_2SiO_{1/2})_2(R^1{}_2SiO_{2/2})_{100}$, and $(R^1{}_3SiO_{1/2})_2(R^1{}_2SiO_{2/2})_{5-20}(HR^1SiO_{2/2})_{10-40}$, and $(HSiO_{3/2})_{0.01-0.5}(R^1SiO_{3/2})_{1-0.5}$ wherein the unit subscripts indicate mole ratios thereof, wherein at each occurrence R$^1$ and R$^f$ are as defined in any ad rem embodiment herein (e.g., Embodiment 23, 38, or 43) and R2 is as defined in any ad rem embodiment herein (e.g., Embodiment 43, 96 or 100)

Embodiment 107 is the method of any one of Embodiments 87-106, wherein the precursor adhesive composition comprises at least one of a non-linear vinyldimethylsiloxy-terminated polydimethylsiloxane, a linear vinyldimethylsiloxy-terminated polydimethylsiloxane, a linear vinyldimethylsiloxy-terminated poly(co-(fluoro(C$_m$)alkyl) methylsiloxane-dimethylsiloxane-vinylmethylsiloxane), a linear vinyldimethylsiloxy-terminated polydimethylsiloxane, a linear trimethylsiloxy-terminated poly(co-dimethylsiloxane-hydrogenmethylsiloxane), a hydrogendimethylsiloxy-terminated siloxane, a trimethylsiloxy-terminated poly (co-(fluoro(C$_m$)alkyl)methylsiloxane-dimethylsiloxane), a linear hydrogendimethylsiloxy-terminated dimethylsiloxane, a linear trimethylsiloxy-terminated poly(co-dimethylsiloxane-hydrogenmethylsiloxane), a poly(co-hydrogensilsesquioxane-((C$_1$-C$_{20}$)alkypsilsesquioxane), and a poly(co-hydrogensilsesquioxane-((C$_6$-C$_{20}$)aryl)silsesquioxane), wherein each fluoro(C$_m$)alkyl independently has 1 to 2m+1 fluorine groups and m is independently 1 to 20.

Embodiment 108 is the method of any one of Embodiments 87-107, wherein the precursor adhesive composition comprises at least one of $(ViMe_2SiO_{1/2})_{1-8}(Me_2SiO_{2/2})_{60-180}(SiO_{4/2})_{1-2}$, $(ViMe_2SiO_{1/2})_{5-20}(Me_3SiO_{1/2})_{15-55}$ $(SiO_{4/2})_{25-85}$, $(ViMe_2SiO_{1/2})_2(Me_2SiO_{2/2})_{75-225}$, $(ViMe_2SiO_{1/2})_2(R^fMeSiO_{2/2})_{100-800}(Me_2SiO_{2/2})_{400-2000}(ViMeSiO_{2/2})_{2-30}$, $(ViMe_2SiO_{1/2})_2(Me_2SiO_{2/2})_{400-1200}$, $(Me_3SiO_{1/2})_2(Me_2SiO_{2/2})_{1-6}(HMeSiO_{2/2})_{3-9}$, $(HMe_2SiO_{1/2})_{1-2}(SiO_{4/2})_{0.5-1.5}$ wherein the unit subscripts indicate mole ratios thereof, $(Me_3SiO_{1/2})_2(R^fMeSiO_{2/2})_{2-40}$ $(HMeSiO_{2/2})_{5-80}$, $(HMe_2SiO_{1/2})_2(Me_2SiO_{2/2})_{50-200}$, $(HSiO_{3/2})_{0.001-1}$ $(MeSiO_{3/2})_{1.5-0.1}$ wherein the unit subscripts indicate mole ratios thereof, and $(HSiO_{3/2})_{0.001-1}$ $(C_6H_5SiO_{3/2})_{1.5-0.1}$ wherein the unit subscripts indicate mole ratios thereof, wherein at each occurrence R$^f$ is independently as defined in any ad rem embodiment herein (e.g., Embodiment 23, 38, or 43).

Embodiment 109 is the method of any one of Embodiments 87-108, wherein the precursor adhesive composition comprises at least one of $(ViMe_2SiO_{1/2})_4(Me_2SiO_{2/2})_{120}$ $(SiO_{4/2})$, $(ViMe_2SiO_{1/2})_{11}(Me_3SiO_{1/2})_{34}(SiO_{4/2})_{55}$, $(ViMe_2SiO_{1/2})_2(Me_2SiO_{2/2})_{150}$, $(ViMe_2SiO_{1/2})_2(R^fMeSiO_{2/2})_{300-600}(Me_2SiO_{2/2})_{800-1000}(ViMeSiO_{2/2})_{5-15}$, $(ViMe_2SiO_{1/2})_2(Me_2SiO_{2/2})_{600}$, $(Me_3SiO_{1/2})_2(Me_2SiO_{2/2})_{3-4}(HMeSiO_{2/2})_{5-6}$, $(HMe_2SiO_{1/2})_{1.58}(SiO_{4/2})$ wherein the unit subscripts indicate mole ratios thereof, $(Me_3SiO_{1/2})_2(R^fMeSiO_{2/2})_{5-20}(HMeSiO_{2/2})_{10-40}$, $(HMe_2SiO_{1/2})_2(Me_2SiO_{2/2})_{100}$, $(HSiO_{3/2})_{0.01-0.5}(MeSiO_{3/2})_{1-0.5}$ wherein the unit subscripts indicate mole ratios thereof, and $(HSiO_{3/2})_{0.01-0.5}$ $(C_6H_5SiO_{3/2})_{1-0.5}$ wherein the unit subscripts indicate mole ratios thereof, wherein at each occurrence $R^f$ is independently as defined in any ad rem embodiment herein (e.g., Embodiment 23, 38, or 43).

Embodiment 110 is the method of any one of Embodiments 87-109, wherein the precursor adhesive composition has an Si—H to alkenyl ratio of 0.1:1 to 10:1.

Embodiment 111 is the method of any one of Embodiments 87-110, wherein the precursor adhesive composition has an Si—H to alkenyl ratio of 0.7:1 to 2:1.

Embodiment 112 is the method of any one of Embodiments 87-111, wherein the precursor adhesive composition comprises at least one of a surfactant, emulsifier, dispersant, polymeric stabilizer, crosslinking agent, polymer, polymerization or crosslinking catalysts, rheology modifier, density modifier, aziridine stabilizers, cure modifier, free radical initiator, diluent, acid acceptor, antioxidant, heat stabilizer, flame retardant, scavenging agent, silylating agent, foam stabilizer, solvent, hydrosilylation-reactive diluent, plasticizer, filler, inorganic particle, pigment, dye, desiccants, liquid, a polyether having at least one alkenyl or akynyl group per molecule, thickening agent, stabilizing agent, wax, wax-like material, silicone, organofunctional siloxane, alkylmethylsiloxanes, siloxane resin, silicone gum, silicone carbinol fluid, water soluble or water dispersible silicone polyether composition, silicone rubber, hydrosilylation catalyst inhibitor, adhesion promoter, heat stabilizer, UV stabilizer, and a flow control additive.

Embodiment 113 is the method of any one of Embodiments 1-112, wherein the adhesive delamination layer has a thickness of 0.1 µm to 500 µm.

Embodiment 114 is the method of any one of Embodiments 1-113, wherein the securing is a display device processing intermediate wherein the adhesive delamination layer is directly on the carrier substrate with no intervening layers.

Embodiment 115 is the method of any one of Embodiments 1-114, wherein the securing provides a display device processing intermediate wherein an adhesion promoter layer is between the carrier substrate and the adhesive delamination layer.

Embodiment 116 is the method of any one of Embodiments 115, wherein the adhesion promoter layer comprises a cured product of an adhesion promoter precursor composition comprising at least one of a silane, an organosilane, an organosiloxane, an organotitanate, an organozirconate, a zirconoaluminate, a phosphate ester, acrylic acid or a salt or ester thereof, methylacrylic acid or a salt or ester thereof, a polyurethane monomer or oligomer, vinyl phosphonic acid or a salt or ester thereof, vinyl sulfonic acid or a salt or ester thereof, and 2-acrylamido-2-methyl propane sulfonic acid or a salt or ester thereof.

Embodiment 117 is the method of any one of Embodiments 115-116, wherein the adhesion promoter layer comprises a cured product of an adhesion promoter precursor composition comprising at least one of a silane or siloxane comprising at least one of a trialkoxysiloxy group, a trialkoxysilylalkyl group, a hydrosilyl group, an alkenyl group, an epoxy-functional group, an amino group, a halosilyl group, a mercaptosilyl group, and a fluoroalkylsilyl group.

Embodiment 118 is the method of any one of Embodiments 115-117, wherein the adhesion promoter layer has a thickness of 0.0001 µm to 500 µm.

Embodiment 119 is the method of any one of Embodiments 115-118, wherein no intervening layers occur between the adhesion promoter layer and the carrier substrate or between the adhesion promoter layer and the adhesive delamination layer.

Embodiment 120 is the method of any one of Embodiments 87-119, wherein the securing comprises placing the display device substrate on the carrier substrate with at least one of the precursor adhesive composition and the adhesive delamination layer therebetween.

Embodiment 121 is the method of any one of Embodiments 87-120, further comprising forming the adhesive delamination layer on at least one of the carrier substrate and the display device substrate prior to the securing of the display device substrate.

Embodiment 122 is the method of Embodiment 121, wherein the forming comprises placing the precursor adhesive composition on at least one of the carrier substrate and the display device substrate, and curing the precursor adhesive composition to form the cured product of the precursor adhesive composition.

Embodiment 123 is the method of Embodiment 122, wherein the placing comprises placing the precursor adhesive composition on at least one of the carrier substrate and the display device using at least one of spraying, spinning, a draw-down bar, a doctor-blade, and dipping.

Embodiment 124 is the method of any one of Embodiments 121-123, further comprising bonding an adhesion promoter layer to the carrier substrate before forming the adhesive delamination layer thereon.

Embodiment 125 is the method of any one of Embodiments 121-124, further comprising bonding an adhesion promoter layer to the adhesive delamination layer prior to securing the carrier substrate thereto.

Embodiment 126 is the method of any one of Embodiments 1-125, further comprising processing the display device substrate.

Embodiment 127 is the method of Embodiment 126, wherein processing the display device substrate comprises at least one of washing, drying, forming a film, applying a liquid photoresist, exposure to light, development, etching, resist removal, sealing, vapor deposition, adhesion treatment, heating, annealing, irradiating, cooling, and at least one of placing, forming and modifying on the display device substrate at least one of a semiconductor material, a semiconductor device, a diode, a light emitting diode, a transistor, a transistor array, a capacitor, a conductive pathway, a circuit pattern, a gate line, a data line, an electrical connector, an electrode, a transparent electrode, an electrical insulator, an electrically insulating layer, a protective layer, a color filter, a liquid crystal, a hole injection layer, a hole transporting layer, a light emitting layer, a passivation layer, an electrophoretic film, and an electron transporting layer.

Embodiment 128 is the method of any one of Embodiments 1-127, further comprising removing the display device substrate from the carrier substrate.

Embodiment 129 is the method of Embodiment 128, wherein the removing comprises peeling the display device substrate from the carrier substrate using a 90 degree peel force of 1 g/cm to 200 g/cm.

Embodiment 130 is the method of any one of Embodiments 128-129, wherein the removing comprises peeling the display device substrate from the carrier substrate using a 90 degree peel force of 2 g/cm to 60 g/cm.

Embodiment 131 is a method of forming a display device or display device component comprising the method of any one of Embodiments 1-130.

Embodiment 132 is a display device or display device component formed by the method of Embodiments 1-131.

Embodiment 133 is a method of processing a display device substrate, the method comprising: securing the display device substrate to a carrier substrate with an adhesive delamination layer and a release layer between the adhesive delamination layer and the display device substrate, wherein the release layer comprises a cured product of a precursor release layer composition comprising at least one of a fluoroorganosilane, a linear Si—H-functional fluoroorganopolysiloxane, and a linear ($C_2$-$C_{20}$)alkenyl-functional fluoroorganopolysiloxane; wherein the fluoroorganosilane is of formula $R^N SiZ_3$, as defined in Embodiment 14. In some embodiments the fluoroorganosilane is of formula $R^N Si(OR^M)_3$, wherein at each occurrence $R^M$ and $R^N$ are as defined in any ad rem embodiment herein (e.g., Embodiment 14). The linear Si—H-functional fluoroorganopolysiloxane is of formula:

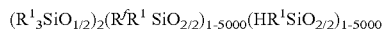

and the linear ($C_2$-$C_{20}$)alkenyl-functional fluoroorganopolysiloxane is of formula:

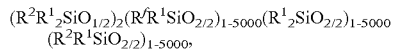

wherein $R^1$, $R^2$, and $R^f$ are as defined in any ad rem embodiment herein (e.g., Embodiment 43).

Embodiment 134 is a display device processing intermediate comprising: a carrier substrate; an adhesive delamination layer on the carrier substrate; a display device substrate secured to the carrier substrate via the adhesive delamination layer; and a release layer between the adhesive delamination layer and the display device substrate, the release layer comprising a cured product of a precursor release layer comprising at least one fluorosilicon compound.

Embodiment 135 is the processing intermediate of Embodiment 134, further comprising an adhesion promoter layer between the carrier substrate and the adhesive delamination layer.

Embodiment 136 is a display device processing intermediate comprising: a carrier substrate; an adhesive delamination layer on the carrier substrate; a display device substrate secured to the carrier substrate via the adhesive delamination layer; and a release layer between the adhesive delamination layer and the display device substrate, the release layer comprising a cured product of a precursor release layer comprising at least one of a fluoroorganosilane, a linear Si—H-functional fluoroorganopolysiloxane, and a linear ($C_2$-$C_{20}$)alkenyl-functional fluoroorganopolysiloxane; wherein the fluoroorganosilane is of formula $R^N SiZ_3$, as defined in Embodiment 14. In some embodiments the fluoroorganosilane is of formula $R^N Si(OR^M)_3$, wherein at each occurrence $R^M$ and $R^N$ are as defined in any ad rem embodiment herein (e.g., Embodiment 14). The linear Si—H-functional fluoroorganopolysiloxane is of formula:

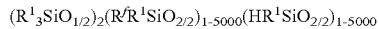

and the linear ($C_2$-$C_{20}$)alkenyl-functional fluoroorganopolysiloxane is of formula:

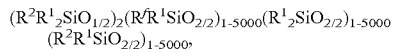

wherein $R^1$, $R^2$, and $R^f$ are as defined in any ad rem embodiment herein (e.g., Embodiment 43).

Embodiment 137 is the apparatus or method of any one or any combination of Embodiments 1-136 optionally configured such that all elements or options recited are available to use or select from.

Embodiment 138 is the release layer as described in any one of Embodiments 1-137.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "0.1% to 5%" or "0.1% to 5%" should be interpreted to include not just 0.1% to 5%, but also the individual values (e.g., 1%, 2%, 3%, and 4%) and the sub-ranges (e.g., 0.1% to 0.5%, 1.1% to 2.2%, 3.3% to 4.4%) within the indicated range.

In the methods of manufacturing described herein, the acts or steps can be carried out in any order without departing from the principles of the invention, except when a temporal or operational sequence is explicitly recited or unambiguously implied. Furthermore, specified acts can be carried out concurrently unless explicit claim language recites that they be carried out separately. For example, a claimed act of doing step X and a claimed act of doing step Y can be conducted simultaneously within a single operation, and the resulting process will fall within the literal scope of the claimed process. In some aspects the acts or steps are carried out in the order as written.

In this document, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B", which has the same meaning as A or B or A and B. Any use of section headings is intended to aid reading of the document and is not limiting; information that is relevant to a section heading may occur within or outside of that particular section.

The term "acyl" as used herein refers to a monovalent group formally derived by removing a HO— group from a carboxylic acid. The group may be unsubstituted or substituted.

The term "alkenyl" as used herein refers to a monovalent unsaturated aliphatic group containing at least one carbon-carbon double bond (C=C). Alkenyl may be straight chain, branched chain, or cyclic. Alkenyl may have 1 or 2 C=C. Alkenyl groups may have from 2 to 40 carbon atoms, or 2 to 20 carbon atoms, or 2 to 12 carbon atoms, or, in some embodiments, from 2 to 8 carbon atoms. Examples include, but are not limited to vinyl, —CH=CH(CH$_3$), —CH=C(CH$_3$)$_2$, —C(CH$_3$)=CH$_2$, —C(CH$_3$)=CH(CH$_3$), —C(CH$_2$CH$_3$)=CH$_2$, cyclohexenyl, cyclopentenyl, cyclohexadienyl, butadienyl, pentadienyl, and hexadienyl among others. The group may be unsubstituted or substituted.

The term "alkoxy" as used herein refers to a monovalent saturated or unsaturated aliphatic-O— group, wherein the aliphatic group is acyclic or cyclic. Examples of linear alkoxy groups include but are not limited to methoxy, ethoxy, propoxy, butoxy, pentyloxy, and hexyloxy. Examples of branched alkoxy include but are not limited to isopropoxy, sec-butoxy, tert-butoxy, isopentyloxy, and isohexyloxy. Examples of cyclic alkoxy include but are not limited to cyclopropyloxy, cyclobutyloxy, cyclopentyloxy, and cyclohexyloxy. An alkoxy group can include 1 to 12, 1 to 20, or 1 to 40 carbon atoms bonded to the oxygen atom, and can further include double or triple bonds, and can also include heteroatoms. For example, an allyloxy group or a methoxyethoxy group is also an alkoxy group within the meaning herein, as is a methylenedioxy group in a context where two adjacent atoms of a structure are substituted therewith. The group may be unsubstituted or substituted.

The term "alkyl" as used herein refers to a monovalent saturated hydrocarbon group that is straight chain, branched chain, or cyclic and has from 1 to 40 carbon atoms, 1 to 20 carbon atoms, 1 to 12 carbons or, in some embodiments, from 1 to 8 carbon atoms. Examples of straight chain alkyl groups include those with from 1 to 8 carbon atoms such as methyl, ethyl, n-propyl, n-butyl, n-pentyl, n-hexyl, n-heptyl, and n-octyl groups. Examples of branched alkyl groups include, but are not limited to, isopropyl, iso-butyl, sec-butyl, t-butyl, neopentyl, isopentyl, and 2,2-dimethylpropyl groups. As used herein, the term "alkyl" encompasses n-alkyl, isoalkyl, and ante-isoalkyl groups as well as other branched chain forms of alkyl. The group may be unsubstituted or substituted. Representative substituted alkyl groups can be substituted one or more times with any of the groups listed herein, for example, amino, hydroxy, cyano, carboxy, nitro, thio, alkoxy, and halogen groups. The term "alkylene" as used herein indicates an alkanediyl wherein the two valencies can be present on any two carbon atoms therein.

The term "alkynyl" as used herein refers to a monovalent unsaturated aliphatic group containing at least one carbon-carbon triple bond (C≡C) and may be straight chain or branched chain. Alkynyl groups may have from 2 to 40 carbon atoms, 2 to 20 carbon atoms, or from 2 to 12 carbons or, in some embodiments, from 2 to 8 carbon atoms. Examples include, but are not limited to —C≡CH, —C≡C(CH$_3$), —C≡C(CH$_2$CH$_3$), —CH$_2$C≡CH, —CH$_2$C≡C(CH$_3$), and —CH$_2$C≡C(CH$_2$CH$_3$) among others. The group may be unsubstituted or substituted.

"Alternatively" shall indicate an independent embodiment.

The term "amine" as used herein refers to a compound formally derived from ammonia (NH$_3$) by independently replacing 1, 2, or 3 hydrogen atoms on ammonia with hydrocarbyl group. The amine may be primary, secondary, and tertiary amines having, e.g., the formula N(group)$_3$ wherein each group can independently be H or non-H, such as alkyl, and aryl. Amines include but are not limited to R—NH$_2$, for example, alkylamines, arylamines, alkylarylamines; R$_2$NH wherein each R is independently selected, such as dialkylamines, diarylamines, aralkylamines, and heterocyclylamines; and R$_3$N wherein each R is independently selected, such as trialkylamines, dialkylarylamines, alkyldiarylamines, and triarylamines. The R may be unsubstituted or substituted.

The term "aryl" as used herein refers to monovalent carbocyclic aromatic hydrocarbon groups. Thus aryl groups include, but are not limited to, phenyl, azulenyl, heptalenyl, biphenyl, indacenyl, fluorenyl, phenanthrenyl, triphenylenyl, pyrenyl, naphthacenyl, chrysenyl, biphenylenyl, anthracenyl, and naphthyl groups. In some embodiments, aryl groups contain 6 to 14 carbons in the ring portions of the groups. Aryl groups can be unsubstituted or substituted with organic groups or non-carbon-containing groups, as defined herein. The group may be unsubstituted or substituted. Representative substituted aryl groups can be mono-substituted or substituted more than once, such as, but not limited to, a phenyl group substituted at any one or more of 2-, 3-, 4-, 5-, or 6-positions of the phenyl ring, or a naphthyl group substituted at any one or more of 2- to 8-positions thereof.

"Can" or "may" confers a permitted choice, not an imperative.

The term "coating" or "film" as used herein refers to a continuous or discontinuous layer of material. The layer may be free standing or disposed on a surface of an article. The layer of material can penetrate the surface of the article and can fill areas such as pores, wherein the layer of material can have any three-dimensional shape, including a flat or curved plane. In one example, a coating can be formed on one or more surfaces, any of which may be porous or nonporous, by immersion in a bath of coating material.

The term "hydrocarbon" as used herein refers to a molecule that may be unsubstituted and consists of carbon and hydrogen atoms or may be substituted and includes carbon and hydrogen atoms and at least one heteroatom selected from halogen, N, O, S, P, and Si.

As used herein, the term "hydrocarbyl" refers to a monovalent functional group formally derived from a straight chain, branched, or cyclic hydrocarbon by removing a hydrogen atom therefrom, and can be alkyl, alkenyl, alkynyl, aryl, cycloalkyl, acyl, or any combination thereof. Hydrocarbyl groups can be shown as $(C_a-C_b)$hydrocarbyl, wherein a and b are integers and mean having any of a to b number of carbon atoms. For example, $(C_1-C_4)$hydrocarbyl means the hydrocarbyl group can be methyl ($C_1$), ethyl ($C_2$), propyl ($C_3$), or butyl ($C_4$). $(C_0-C_b)$hydrocarbyl means in certain embodiments there is no hydrocarbyl group.

The term "interrupted", as applied to a monovalent group having a radical at a backbone atom, means (i) or (ii): (i) in a monovalent group having 1 backbone atom, which thus has the radical: interrupted means formally inserted between the 1 backbone atom and the radical (e.g., a divalent interrupting group, Q, formally inserted in H$_3$C— to give H$_3$C-Q-); or (ii) in a monovalent group having 2 or more backbone atoms, wherein the radical is located on any one thereof: interrupted means formally inserted either between a backbone atom and the radical (e.g., as above) or between any two of the backbone atoms (e.g., a divalent interrupting group Q formally inserted in H$_3$C—CH$_2$— to give H$_3$C-Q-CH$_2$—). Typically each monovalent group that is interrupted may be independently interrupted by 1, 2 or 3 interrupting groups Q; alternatively by 1 or 2 interrupting groups Q; alternatively by 2 or 3 interrupting groups Q; alternatively by 1 interrupting group Q; alternatively by 2 interrupting groups Q; alternatively by 3 interrupting groups Q. When there are 2 or 3 Q groups, they typically are not bonded directly to each other (that is, the interrupted monovalent group having 2 or 3 interrupting groups Q may be free of a Q-Q group). Each interrupted monovalent group independently may be defined as described elsewhere herein (e.g., an interrupted hydrocarbyl or an interrupted $(C_2-C_{20})$alkenyl). Each interrupting group Q independently may be defined as for the interrupting groups described elsewhere herein (e.g., —O—, —S—, substituted or unsubstituted —NH—, —(O—(C$_2$-C$_3$)alkylene)$_n$- wherein n is 1 to 1,000, —Si((C$_1$-C$_5$)alkoxy)$_2$-, or —Si((C$_1$-C$_5$)alkyl)$_2$-). The term "interrupted" may be applied to a molecule or to a multivalent group in an analogous manner as described above. The term "uninterrupted" means free of (lacking) a divalent interrupting group Q (i.e., 0 Q).

The term "linear" means lacking or being free of a branch point. For example, a linear polysiloxane (e.g., a linear hydrogenorganopolysiloxane and linear alkenyl-functional organopolysiloxane) has no (i.e., 0) branch points in its backbone. Thus, its backbone is consists of M units (e.g., $R^1_3SiO_{1/2}$, $HR^1_2SiO_{1/2}$, or $Me_3SiO_{1/2}$) and D units (e.g., $R^1_2SiO_{2/2}$, $HR^1SiO_{2/2}$, or $Me_2SiO_{2/2}$) only.

The term "non-linear" means having at least one branch point. For example, a non-linear polysiloxane (e.g., a non-linear hydrogenorganopolysiloxane and non-linear alkenyl-functional organopolysiloxane) has at least one branch point in its backbone. Each branch point independently may be a T unit (e.g., $R^1SiO_{3/2}$, $R^2SiO_{3/2}$, or $HSiO_{3/2}$) or a Q unit ($SiO_{4/2}$), as the case may be. The non-linear polysiloxane may, alternatively may not, further have M and/or D units, as the case may be.

The term "number-average molecular weight" ($M_n$) as used herein refers to the ordinary arithmetic mean of the molecular weight of individual molecules in a sample. It is defined as the total weight of all molecules in a sample divided by the total number of molecules in the sample. Experimentally, $M_n$ is determined by analyzing a sample divided into molecular weight fractions of species i having $n_i$ molecules of molecular weight $M_i$ through the formula $M_n = \Sigma M_i n_i / \Sigma n_i$. The $M_n$ can be measured by a variety of well-known methods including gel permeation chromatography, spectroscopic end group analysis, and osmometry. The measurement may use polystyrene standards of known $M_n$. If unspecified, molecular weights of polymers given herein are number-average molecular weights.

The term "oligomer" as used herein refers to a molecule having an intermediate relative molecular mass, the structure of which essentially includes from 2 to 4 repeat units derived, actually or conceptually, from molecules of lower relative molecular mass (e.g., monomers or oligomers of fewer repeat units). A molecule having an intermediate relative mass can be a molecule that has properties that vary with the removal of one or a few of the units. The variation in the properties that results from the removal of the one of more units can be a significant variation.

The term "organic group" as used herein refers to any monovalent or multivalent carbon-containing functional group. Each organic group independently may be unsubstituted, alternatively unsubstituted. For example, an oxygen-containing group such as an alkoxy group, aryloxy group, aralkyloxy group, oxo(carbonyl) group, a carboxyl group including a carboxylic acid, carboxylate, and a carboxylate ester; a sulfur-containing group such as an alkyl and aryl sulfide group; and other heteroatom-containing groups. Non-limiting examples of organic groups include OR, OOR, OC(O)N(R)$_2$, CN, CF$_3$, OCF$_3$, R, C(O), methylenedioxy, ethylenedioxy, N(R)$_2$, SR, SOR, SO$_2$R, SO$_2$N(R)$_2$, SO$_3$R, C(O)R, C(O)C(O)R, C(O)CH$_2$C(O)R, C(S)R, C(O)OR, OC(O)R, C(O)N(R)$_2$, OC(O)N(R)$_2$, C(S)N(R)$_2$, (CH$_2$)$_{0-2}$N(R)C(O)R, (CH$_2$)$_{0-2}$N(R)N(R)$_2$, N(R)N(R)C(O)R, N(R)N(R)C(O)OR, N(R)N(R)CON(R)$_2$, N(R)SO$_2$R, N(R)SO$_2$N(R)$_2$, N(R)C(O)OR, N(R)C(O)R, N(R)C(S)R, N(R)C(O)N(R)$_2$, N(R)C(S)N(R)$_2$, N(COR)COR, N(OR)R, C(=NH)N(R)$_2$, C(O)N(OR)R, C(=NOR)R, and substituted or unsubstituted (C$_1$-C$_{100}$)hydrocarbyl, wherein R can be hydrogen (in examples that include other carbon atoms) or a carbon-based group, and wherein the carbon-based group can be substituted or unsubstituted.

Organosiloxanes may contain different types of units, at least one of which contains a silicon-bonded organic group (Si—C). Methyl-containing siloxane units are [(CH$_3$)$_3$SiO$_{1/2}$], [(CH$_3$)$_2$SiO$_{2/2}$], and [(CH$_3$)SiO$_{3/2}$], which are sometimes abbreviated as M, D, and T, respectively, i.e., without superscripts. Another type of organosiloxane unit is [SiO$_{4/2}$], which is abbreviated as Q. Other types of organosiloxane units are M, D, and T units that contain at least one occurrence of an atom or group in place of a methyl. For example, the 1, 2 or 3 methyl(s) in a [(CH$_3$)$_3$SiO$_{1/2}$] unit; the 1 or 2 methyl(s) in a [(CH$_3$)$_2$SiO$_{2/2}$] unit; and the 1 methyl in a [(CH$_3$)SiO$_{3/2}$] unit independently may be replaced by an atom such as H or halogen, an inorganic group such as hydroxyl, or an organic group other than methyl. Such M, D, and T units containing replacement atom(s) or group(s) in place of methyl are sometimes abbreviated by writing the replacement atom(s) or group(s) in superscript above the respective M, D, or T letter. The number of methyls that have been replaced is indicated by the number of superscripted groups. For example, M$^{Vi}$ indicates an M unit having one vinyl (Vi) and two methyls (i.e., [Vi(CH$_3$)$_2$SiO$_{1/2}$]), whereas M$^{2Vi}$ indicates an M unit having two vinyls and one methyl (i.e., [Vi$_2$(CH$_3$)SiO$_{1/2}$]). Similarly, D$^H$ indicates a D unit having one hydrogen atom and one methyl (i.e., [H(CH$_3$)SiO$_{2/2}$]), whereas D$^{H,Ph}$ indicates a D unit having 0 methyl, one H atom, and one phenyl (i.e., [H(Ph)SiO$_{2/2}$]). T$^{OAlk}$ indicates a T unit having 0 methyl and one alkoxy group (i.e., [AlkOSiO$_{3/2}$]), wherein AlkO and OAlk indicates a same alkoxy group.

As used herein, the term "polymer" refers to a molecule having at least five repeat units and can include homopolymers and interpolymers such as copolymers.

Unless indicated otherwise by chemical nomenclature or valence requirements, each "R" group herein is a monovalent group. Examples of "R" groups are R, $R^1$, $R^2$, $R^A$, $R^B$, and $R^f$.

The term "resin" as used herein refers to polysiloxane material of any viscosity including a molecule that includes at least four siloxane units, wherein at least one siloxane unit is bonded via a Si—O—Si bond to three or four other siloxane units. In one example, the polysiloxane material includes a majority of T and/or Q units, as defined herein.

The term "solvent" as used herein refers to a liquid that can dissolve a solid, liquid, or gas. Non-limiting examples of solvents are silicone fluids, organic compounds having boiling points from 30° to 300° C. such as alcohols, water, ionic liquids, and supercritical fluids. In a particular mixture embodiment herein, a solvent may, alternatively may not fully dissolve a particular constituent. A solvent that does not fully dissolve a particular constituent may function as a carrier, diluent, dispersant, hosting medium, or supernatant.

The term "substantially" as used herein refers to a majority of, or mostly, as in at least 60%, 70%, 80%, 90%, 95%, 96%, 97%, 98%, 99%, 99.5%, 99.9%, 99.99%, or 99.999%; alternatively 100%.

The term "substituted" as used herein in conjunction with a molecule or an organic group as defined herein refers to the state in which one or more hydrogen atoms contained therein are replaced by one or more non-hydrogen atoms. The term "functional group" or "substituent" as used herein refers to a group that can be or is substituted onto a molecule or onto an organic group. Examples of substituents or functional groups include, but are not limited to, a halogen (e.g., F, Cl, Br, and I; alternatively F, Cl, or Br; alternatively F or Cl; alternatively Cl or Br; alternatively F; alternatively Cl); an oxygen atom in groups such as hydroxy groups, alkoxy groups, aryloxy groups, aralkyloxy groups, oxo (carbonyl) groups, carboxyl groups including carboxylic acids, carboxylates, and carboxylate esters; a sulfur atom in groups such as thiol groups, alkyl and aryl sulfide groups, sulfoxide groups, sulfone groups, sulfonyl groups, and sulfonamide groups; a nitrogen atom in groups such as amines, hydroxyamines, nitriles, nitro groups, N-oxides, hydrazides, azides, and enamines; and other heteroatoms in various other groups. Non-limiting examples of substituents that can be bonded to a substituted carbon (or other) atom include F, Cl, Br, I, OR, OC(O)N(R)$_2$, CN, NO, NO$_2$, ONO$_2$, azido, CF$_3$, OCF$_3$, R, O, =O (oxo), S (thiono), C(O), S(O), methylenedioxy, ethylenedioxy, N(R)$_2$, SR, SOR, SO$_2$R, SO$_2$N(R)$_2$, SO$_3$R, C(O)R, C(O)C(O)R, C(O)CH$_2$C(O)R, C(S)R, C(O)OR, OC(O)R, C(O)N(R)$_2$, OC(O)N(R)$_2$, C(S)N(R)$_2$, (CH$_2$)$_{0-2}$N(R)C(O)R, (CH$_2$)$_{0-2}$N(R)N(R)$_2$, N(R)N(R)C(O)R, N(R)N(R)C(O)OR, N(R)N(R)CON(R)$_2$, N(R)SO$_2$R, N(R)SO$_2$N(R)$_2$, N(R)C(O)OR, N(R)C(O)R, N(R)C (S)R, N(R)C(O)N(R)$_2$, N(R)C(S)N(R)$_2$, N(COR)COR, N(OR)R, C(=NH)N(R)$_2$, C(O)N(OR)R, and C(=NOR)R, wherein R can be hydrogen or a carbon-based group; for example, R can be hydrogen, (C$_1$-C$_{100}$)hydrocarbyl, alkyl, acyl, cycloalkyl, aryl, aralkyl, heterocyclyl, heteroaryl, or heteroarylalkyl; or wherein two R groups bonded to a nitrogen atom or to adjacent nitrogen atoms can together with the nitrogen atom or atoms form a heterocyclyl. In the substituents, each R is independently unsubstituted or substituted with F.

As used herein "Vi" indicates a vinyl group, —CH$_2$=CH$_2$. As used herein, "Me" indicates a methyl group, —CH$_3$. "Ph" means phenyl, C$_6$H$_5$—.

Any compound includes all "Isotopic forms" thereof, including natural abundance isotopes, isotopically-enriched isotopes, and mixtures thereof. In some aspects, the isotopic forms are the natural abundance isotopes, alternatively the isotopically-enriched isotopes. The isotopically-enriched forms of a silicon-containing compound have a greater-than-natural-abundance amount of deuterium, tritium, $^{29}$Si, $^{30}$Si, $^{32}$Si, or a combination of any two or more thereof. Isotopically-enriched forms of the compound may have additional uses wherein detection of the isotopically-enriched compound or an isotopically-enriched material made or synthesized therefrom would be helpful. Examples of such uses are medical research and anti-counterfeiting applications.

In some aspects any composition may be free of one or more of the following chemical elements: (i) at least one chemical element from any one of Groups 2 to 13 and 18, including the lanthanoids and actinoids; (ii) at least one chemical element from any one of the third to sixth rows of the Periodic Table of the Elements, including the lanthanoids and actinoids; or (iii) both (i) and (ii), except not excluding Si, O, H, C, N, a halogen, a metal of any catalyst described elsewhere herein. In some aspects any composition does not contain a chemical element having any one of the following atomic numbers: 2, 3, 4, 5, 7, 10, 11, 12, 13, 15, 16, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84. 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, and 116, except for the metal of any catalyst described elsewhere herein. "Chemical element" or "atom", a Group or Groups of chemical elements, or a Periodic Table of the Elements shall mean the chemical elements, Group(s), and Periodic Table of the Elements published by IUPAC, version dated 1 May 2013; see iupac.org/reports/periodic_table/).

In compounds that are salts having positively charged counterions, the counterion can be any suitable positively charged counterion. For example, the counterion can be ammonium (NH$_4^+$), or an alkali metal such as sodium (Na+), potassium (K$^+$), or lithium (Li$^+$). In some embodiments, the counterion can have a positive charge greater than +1, which can in some embodiments complex to multiple ionized groups, such as Zn$^{2+}$, Al$^{3+}$, or alkaline earth metals such as Ca$^{2+}$ or Mg$^{2+}$.

In various embodiments is a method of processing a display device substrate. The method includes securing the display device substrate to a carrier substrate with an adhesive delamination layer and a release layer between the adhesive delamination layer and the display device substrate. The release layer includes a cured product of a precursor release layer composition. The precursor release layer composition includes at least one fluorosilicon compound.

In various embodiments is a method of processing a display device substrate. The method includes securing the display device substrate to a carrier substrate with an adhesive delamination layer and a release layer between the adhesive delamination layer and the display device substrate. The release layer includes a cured product of a precursor release layer composition. The precursor release layer composition includes at least one of a fluororganosilane, a linear Si—H-functional fluoroorganopolysiloxane, and a linear (C$_2$-C$_{20}$)alkenyl-functional fluoroorganopolysiloxane. The fluoroorganosilane is of formula R$^N$SiZ$_3$, as defined in Embodiment 14. In some embodiments the fluoroorganosilane is of formula R$^N$Si(OR$^M$)$_3$, wherein R$^N$ and R$^M$ are as defined herein (e.g., Embodiment 14). The linear Si—H-functional fluoroorganopolysiloxane is of formula:

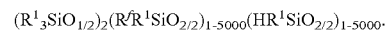

The linear (C$_2$-C$_{20}$)alkenyl-functional fluoroorganopolysiloxane is of formula:

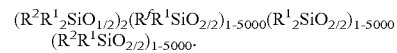

R$^1$, R$^2$, and R$^f$ are as defined in any ad rem embodiment herein (e.g., Embodiment 43).

In various embodiments is a display device processing intermediate. The display device processing intermediate includes a carrier substrate. The display device processing intermediate includes an adhesive delamination layer on the carrier substrate. The display device processing intermediate includes a display device substrate secured to the carrier substrate via the adhesive delamination layer. The display device processing intermediate also includes a release layer between the adhesive delamination layer and the display device substrate, the release layer including a cured product of a precursor release layer including at least one fluorosilicon compound.

In various embodiments is a display device processing intermediate. The display device processing intermediate includes a carrier substrate. The display device processing intermediate includes an adhesive delamination layer on the carrier substrate. The display device processing intermediate includes a display device substrate secured to the carrier substrate via the adhesive delamination layer. The display device processing intermediate also includes a release layer between the adhesive delamination layer and the display device substrate, the release layer including a cured product of a precursor release layer including at least one of a fluoroorganosilane, a linear Si—H-functional fluoroorganopolysiloxane, and a linear (C$_2$-C$_{20}$)alkenyl-functional fluoroorganopolysiloxane. The fluoroorganosilane is of formula R$^N$SiZ$_3$, as defined in Embodiment 14. In some embodiments the fluoroorganosilane is of formula R$^N$Si(OR$^M$)$_3$, wherein R$^N$ and R$^M$ are as defined herein (e.g., Embodiment 14). The linear Si—H-functional fluoroorganopolysiloxane is of formula:

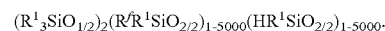

The linear (C$_2$-C$_{20}$)alkenyl-functional fluoroorganopolysiloxane is of formula:

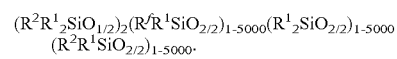

R$^1$, R$^2$, and R$^f$ are as defined in any ad rem embodiment herein (e.g., Embodiment 43).

In various embodiments are certain advantages over existing methods for processing display device substrates where the existing methods include mounting the display device substrate on a carrier. For example, in some embodiments, compared to existing methods, the method can better withstand the harsh chemical treatments (e.g., acids having a logarithmic acid dissociation constant, pKa, of ≤3) or elevated temperatures (e.g., ≥200° C.) used during certain manufacturing processes. In some embodiments, the method can more firmly retain the display device substrate during certain manufacturing processes than existing methods. Some existing mounting methods allow for a greater amount of relative movement between the carrier and the display substrate or of flexing of the display substrate, leading to misalignment of electronic components on the display substrate. In various embodiments, the present method can allow the display substrate to be removed from the carrier more easily, e.g., with a lower peeling force, than existing methods. A failure due to movement of the display substrate relative to the carrier during manufacturing, or due to damage to the display substrate during mounting, manufacturing, or removal, can mean a shutdown of an entire manufacturing line. In various embodiments is a method of processing a display device substrate with a lower failure rate than existing methods.

In some embodiments, after removal of the display device substrate from the carrier, the carrier can be reused several times without an extensive recycling procedure. In some embodiments, conventional equipment and chemicals can be used with little or no modification to perform the method, in contrast to the exotic equipment or chemicals required by existing methods.

The display device substrate can include any suitable material that can be formed into a component for a display device. The carrier substrate can be any suitable material, such that the method can be carried out as described herein. In various embodiments the carrier substrate includes or is the same material as the display device substrate. In some embodiments, the display device substrate and carrier substrate independently includes a silicate glass, silicon (e.g., silicon wafer), ceramic, plastic (e.g., a thermoplastic organic or silicone polymer), metal (e.g. steel, copper), or a combination thereof. The display device substrate and carrier substrate independently can be a treated substrate, having any suitable one or more chemical treatments or physical treatments performed thereon, such that that display device substrate and/or carrier substrate independently includes one or more coatings or processing intermediates thereon, or includes a surface having any suitable topography such as a smooth, polished, or textured surface. In some embodiments, the display device substrate and/or carrier substrate can have a raw surface that is uncoated and untreated. The display device substrate can be flexible or rigid. The display device substrate can have any suitable thickness, such as 1 nm to 5 mm, 1 nm to 0.5 mm, or 1 nm to 100 μm, or more than 5 mm. The carrier substrate can have any suitable amount of rigidity, such that the display device substrate can be securely held during processing and subsequently removed from the carrier substrate. The carrier substrate can have any suitable thickness, such that the method can be performed as described herein. For example, the carrier substrate can have a thickness as 0.1 mm to 1,000 mm, or less than 0.1 mm, or 0.2 mm to 500 mm, or more than 1,000 mm. In various embodiments, the carrier substrate and the display device substrate can include or can be materials that have similar linear expansion coefficients, such as differing by no more than $150\times10^{-7}/°$ C. or less, $50\times10^{-7}/°$ C. or less, or no more than $1\times10^{-10}/°$ C. or less, or no more than $1\times10^{-9}/°$ C., $1\times10^{-8}/°$ C., $1\times10^{-7}/°$ C., $1\times10^{-6}/°$ C., $1\times10^{-5}/°$ C., $1\times10^{-4}/°$ C., $1\times10^{-3}/°$ C., $1\times10^{-2}/°$ C., or $1\times10^{-1}/°$ C.

The display device substrate can include any suitable display device processing precursor that can be processed to form a display device component of at least one of a light-emitting diode display (LED), an electroluminescent display (ELD), an electronic paper display, a plasma display panel (PDP), a liquid crystal display (LCD), a high-performance addressing display (HPA), thin-film transistor display (TFT), organic light-emitting diode display (OLED), surface-conduction electron-emitter display (SED), a laser TV display, a carbon nanotubes display, a quantum dot display, and an interferometric modulator display (IMOD).

The adhesive delamination layer can have any suitable thickness, such that the method can be carried out as described herein. In some embodiments, the adhesive delamination layer can have a thickness of 0.1 μm to 500 μm, 5 μm to 150 μm, 10 μm to 100 μm, or more than 500 μm.

The securing of the display device substrate to the carrier substrate via the adhesive delamination layer can be any suitable securing. The securing can include contacting the display device substrate and at least one of the adhesive delamination layer and the precursor adhesive composition. The contacting can be performed using various means such as pressure bonding with a roll or press, under conditions suitable to achieve close adherence of the display device substrate to the adhesive delamination layer, such as vacuum (e.g., to remove air and prevent bubbles, and optionally with heat, light, or irradiation (e.g., to cure the precursor adhesive composition). By carrying out pressure bonding under vacuum, even if some bubbles remain, growth of the bubbles during heating is reduced or eliminated, avoiding or reducing formation of a deformation defect of the laminated carrier substrate and display device substrate. In some embodiments, the adhesive delamination layer is cured prior to, alternatively after, alternatively prior to and after the contacting of the display device substrate to the adhesive delamination layer. The carrier substrate, the display device substrate, or both, can be washed prior to performing the securing, such as prior to contacting either substrate with the adhesive delamination layer or the precursor adhesive composition.

The method can include forming the adhesive delamination layer on at least one of the carrier substrate and the display device substrate prior to the securing of the display device substrate to the carrier substrate. The forming can include placing the precursor adhesive composition on at least one of the carrier substrate and the display device substrate, and curing the precursor adhesive composition to form the cured product thereof. Placing the precursor adhesive composition on at least one of the carrier substrate and the display device substrate can occur prior to securing the display device substrate to the carrier substrate. Placing the precursor adhesive composition on at least one of the carrier substrate and the display device can include any suitable method, such as using at least one of spraying, spinning, a draw-down bar, a doctor-blade, and dipping.

Curing the precursor adhesive composition to form the adhesive delamination layer can occur before, during, and/or after securing the display device substrate to the carrier substrate. The term "cure" as used herein refers to converting a prepolymer or polymer into a polymer of higher molecular mass, and then into a network. Curing may comprise exposing the precursor adhesive composition to radiation in any form, heating, or allowing to undergo a physical or chemical reaction that results in hardening or an increase in dynamic viscosity measured at 25° C. In some embodiments, the curing of the precursor adhesive composition can be any suitable curing, such as free-radical curing, condensation curing, addition curing (e.g., hydrosilylation), any suitable crosslinking reaction, or a combination thereof. Curing can include the application of light (e.g., visible, infrared, ultraviolet), heat (e.g., 40° C. or less, or from 50° C. to 500° C., e.g., from 80° C. to 300° C., or from 120° to 250° C., for a suitable time, such as 1 minute or less, or 2 minutes to 120 minutes, irradiation (e.g., electron beam, gamma ray, X-ray), or a combination thereof.

In various embodiments, the securing of the display device substrate to the carrier substrate via the adhesive delamination layer can provide a display device processing intermediate wherein the adhesive delamination layer is directly on the carrier substrate and/or on the display device substrate with no intervening layers therebetween. In other embodiments, one or more additional intervening layers can be formed or can occur between the adhesive delamination layer and the carrier substrate, such as an adhesion promoter layer and/or a release layer. In some embodiments, one or more additional intervening layers can occur between the adhesive delamination layer and the display device substrate, such as a release layer. In some embodiments the display device processing intermediate may contain the adhesion promoting layer between the adhesive delamination layer and the carrier substrate and the release layer between the adhesive delamination layer and the display device substrate.

In some embodiments, the securing of the carrier substrate and the display device substrate can include forming the adhesive delamination layer on a carrier substrate or display device substrate that includes an adhesion promoter layer. In some embodiments, the securing of the carrier substrate and the display device substrate can include bonding an adhesion promoter layer to the carrier substrate before forming the adhesive delamination layer on the carrier substrate or the display device substrate. The securing can provide a display device processing intermediate wherein an adhesion promoter layer is between the carrier substrate and the adhesive delamination layer. In some embodiments, no intervening layers occur 1) between the adhesion promoter layer and the carrier substrate, 2) between the adhesion promoter layer and the adhesive delamination layer, or 3) a combination thereof.

In some embodiments, the securing of the carrier substrate and the display device substrate can include securing the display device substrate to the adhesive delamination layer via a release layer, wherein the release layer is on the adhesive delamination layer or on the display device substrate prior to the securing. In some embodiments, the securing of the carrier substrate and the display device substrate can include bonding a release layer to the display device substrate or bonding a release layer to the adhesive delamination layer. The securing can provide a display device processing intermediate wherein a release layer is between the display device substrate and the adhesive delamination layer. In some embodiments, no intervening layers occur 1) between the release layer and the display device substrate, 2) between the release layer and the adhesive delamination layer, or 3) a combination thereof.

In some embodiments, the method is free of processing of the display device substrate. In some embodiments, the method can include processing the display device substrate. The processing of the display device substrate can include any suitable processing such as at least one of washing, drying, forming a film, applying a liquid photoresist, exposure to light, development, etching, resist removal, sealing, vapor deposition, adhesion treatment, heating, annealing, irradiating, cooling, and at least one of placing, forming and modifying on the display device substrate at least one of a semiconductor material, a semiconductor device, a diode, a light emitting diode, a transistor, a transistor array, a capacitor, a conductive pathway, a circuit pattern, a gate line, a data line, an electrical connector, an electrode, a transparent electrode, an electrical insulator, an electrically insulating layer, a protective layer, a color filter, a liquid crystal, a hole injection layer, a hole transporting layer, a light emitting layer, a passivation layer, an electrophoretic film, and an electron transporting layer.

In various embodiments, the method can include removing the display device substrate from the carrier substrate. The removing can occur before, alternatively after processing of the display device substrate. The removing can be performed in any suitable way, such that the display device substrate is removed from the carrier substrate. The removing can include removing the display device substrate from the carrier substrate such that substantially none of the adhesive delamination layer is adhered to the display device substrate after the removal, and such that substantially none of any other layer (e.g., release layer) is adhered to the display device substrate after the removal. The removing can include removing the display device substrate from the carrier substrate such that substantially none of the adhesive delamination layer is adhered to the display device substrate after the removal, wherein all or some of another layer (e.g., a release layer) is adhered to the display device substrate after the removal.

The removing can include physically removing such as peeling, chemically removing such as with acid or base treatment, or a combination thereof. The adhesive delamination layer and any other layers can be formed in such a way that a 90 degree peel force sufficient to remove the display device substrate from the carrier substrate can be 1 gram per centimeter (g/cm) to 200 g/cm, 2 g/cm to 60 g/cm, or 1 g/cm or less, or 100 g/cm to 200 g/cm. The length indicates the width of the overlapping and adhered portions of the display device substrate and the carrier substrate at the location of removal.

In some embodiments, the method can include forming a display device or display device component, such as after the removing. In other embodiments, the method can be performed without forming a display device or display device component.

The precursor adhesive composition can include any one or more components suitable for curing to form the adhesive delamination layer. In various embodiments, the precursor adhesive composition includes at least one of an organohydrogensilane, an organohydrogensiloxane, an organoalkenylsilane, and an organoalkenylsiloxane. The precursor adhesive composition can include at least one of a non-linear ($C_2$-$C_{20}$)alkenyl-functionalized organopolysiloxane, a linear ($C_2$-$C_{20}$)alkenyl-functionalized organopolysiloxane, a linear ($C_2$-$C_{20}$)alkenyl-functionalized fluoro($C_1$-$C_{20}$)alkyl-substituted organopolysiloxane, a non-linear hydrogenorganopolysiloxane, a linear hydrogenorganopolysiloxane, and a (($C_1$-$C_{20}$)hydrocarbyphydrogensilsesquioxane, wherein the ($C_2$-$C_{20}$)alkenyl group and ($C_1$-$C_{20}$)hydrocarbyl are independently selected, substituted or unsubstituted, and are uninterrupted or interrupted by 1, 2, or 3 groups independently chosen from —O—, —S—, substituted or unsubstituted —NH—, —(O—($C_2$-$C_3$)alkylene)$_n$- wherein n is 1 to 1,000, —Si(($C_1$-$C_5$)alkoxy)$_2$-, and —Si(($C_1$-$C_5$)alkyl)$_2$-.

The precursor adhesive composition can include a linear hydrogenorganopolysiloxane being of formula:

$$(R^A_3SiO_{1/2})_2(R^A_2SiO_{2/2})_x.$$

At each occurrence, $R^A$ can be independently selected from H and $R^1$, wherein $R^1$ is as defined in any ad rem embodiment herein (e.g., Embodiment 23). At least one $R^A$ in the linear hydrogenorganopolysiloxane can be H, including pendant Si—H, terminal Si—H, or a combination thereof. The group $R^1$ can be a $(C_1-C_{20})$hydrocarbyl. The group $R^1$ can be a $(C_1-C_5)$alkyl. The group $R^1$ can be methyl. The subscript x can be 0 to 5,000, 0 to 2,000, 0 to 1,000, 0 to 500, 1 to 200. The linear hydrogenorganopolysiloxane can be of the formula:

$$(R^1_3SiO_{1/2})_2(R^1_2SiO_{2/2})_{1-5000}(HR^1SiO_{2/2})_{1-5000},$$

wherein $R^1$ is as defined above.

The linear hydrogenorganopolysiloxane can be of the formula:

$$(Me_3SiO_{1/2})_2(Me_2SiO_{2/2})_{1-100}(HMeSiO_{2/2})_{1-100}.$$

The linear hydrogenorganopolysiloxane can be of the formula:

$$(Me_3SiO_{1/2})_2(Me_2SiO_{2/2})_{3-4}(HMeSiO_{2/2})_{5-6}.$$

The precursor adhesive composition can include a non-linear hydrogenorganopolysiloxane being of formula:

$$(R^A_3SiO_{1/2})_w(R^A_2SiO_{2/2})_x(R^ASiO_{3/2})_y(SiO_{4/2})_z.$$

At each occurrence, $R^A$ can be independently selected from H and $R^1$, wherein $R^1$ is as defined in any ad rem embodiment herein (e.g., Embodiment 23). At least one $R^A$ in the non-linear hydrogenorganopolysiloxane can be H, including pendant Si—H, terminal Si—H, or a combination thereof. The group $R^1$ can be a $(C_1-C_{20})$hydrocarbyl. The group $R^1$ can be a $(C_1-C_5)$alkyl. The group $R^1$ can be methyl. The subscripts y and z can be independently 0 to 5,000, 0 to 2,000, 0 to 1,000, 0 to 500, 0 to 200, or 1 to 200. At least one of y and z can be greater than 0. The subscripts w and x can be independently 0 to 5,000, 0 to 2,000, 0 to 1,000, 0 to 500, 0 to 200, or 1 to 200.

The precursor adhesive composition can include a linear $(C_2-C_{20})$alkenyl-functionalized organopolysiloxane being of formula:

$$(R^B_3SiO_{1/2})_2(R^B_2SiO_{2/2})_x.$$

At each occurrence, $R^B$ can be independently selected from $R^1$ and $R^2$, wherein $R^1$ and $R^2$ are as defined in any ad rem embodiment herein (e.g., Embodiment 43). At least one $R^B$ in the linear $(C_2-C_{20})$alkenyl-functionalized organopolysiloxane can be $R^2$, including pendant Si—$R^2$, terminal Si—$R^2$, or a combination thereof. The group $R^1$ can be a $(C_1-C_{20})$hydrocarbyl. The group $R^1$ can be a $(C_1-C_5)$alkyl. The group $R^1$ can be methyl. The group $R^2$ can be a $(C_2-C_{20})$alkenyl. The group $R^2$ can be a vinyl group. The subscript x can be 0 to 5,000, 0 to 2,000, 0 to 1,000, 0 to 500, 0 to 200, or 1 to 200. The linear $(C_2-C_{20})$alkenyl-functionalized organopolysiloxane can be of the formula:

$$(R^2R^1_2SiO_{1/2})_2(R^1_2SiO_{2/2})_{1-5000},$$

wherein $R^1$ and $R^2$ are as defined above.

The linear $(C_2-C_{20})$alkenyl-functionalized organopolysiloxane can be of the formula:

$$(ViMe_2SiO_{1/2})_2(Me_2SiO_{2/2})_{100-3000}.$$

The linear $(C_2-C_{20})$alkenyl-functionalized organopolysiloxane can be of the formula:

$$(ViMe_2SiO_{1/2})_2(Me_2SiO_{2/2})_{600}.$$

The precursor adhesive composition can include a non-linear $(C_2-C_{20})$alkenyl-functionalized organopolysiloxane being of formula:

$$(R^B_3SiO_{1/2})_w(R^B_2SiO_{2/2})_x(R^BSiO_{3/2})_y(SiO_{4/2})_z.$$

At each occurrence, $R^B$ can be independently selected from $R^1$ and $R^2$, wherein $R^1$ and $R^2$ are as defined in any ad rem embodiment herein (e.g., Embodiment 43). At least one $R^B$ in the non-linear $(C_2-C_{20})$alkenyl-functionalized organopolysiloxane can be $R^2$, including pendant Si—$R^2$, terminal Si—$R^2$, or a combination thereof. The group $R^1$ can be a $(C_1-C_{20})$hydrocarbyl. The group $R^1$ can be a $(C_1-C_5)$alkyl. The group $R^1$ can be methyl. The group $R^2$ can be a $(C_2-C_{20})$alkenyl. The group $R^2$ can be a vinyl group. The subscripts y and z can be independently 0 to 5,000, 0 to 2,000, 0 to 1,000, 0 to 500, 0 to 200, or 1 to 200. At least one of y and z can be greater than 0. The subscripts w and x can be independently 0 to 5,000, 0 to 2,000, 0 to 1,000, 0 to 500, 0 to 200, or 1 to 200. The non-linear $(C_2-C_{20})$alkenyl-functionalized organopolysiloxane can be of the formula:

$$(R^2R^1_2SiO_{1/2})_{1-100}(R^1_3SiO_{1/2})_{1-100}(SiO_{4/2})_{1-500},$$

wherein $R^1$ and $R^2$ are as defined above.

The non-linear $(C_2-C_{20})$alkenyl-functionalized organopolysiloxane can be of the formula:

$$(ViMe_2SiO_{1/2})_{5-20}(Me_3SiO_{1/2})_{10-50}(SiO_{4/2})_{20-80}.$$

The non-linear $(C_2-C_{20})$alkenyl-functionalized organopolysiloxane can be of the formula:

$$((ViMe_2SiO_{1/2})_{11}(Me_3SiO_{1/2})_{34}(SiO_{4/2})_{55}).$$

In various embodiments, the precursor adhesive composition includes at least one of $(R^2R^1_2SiO_{1/2})_{1-20}(R^1_2SiO_{2/2})_{10-300}(SiO_{4/2})_{1-5}$, $(R^2R^1_2SiO_{1/2})_{1-100}(R^1_2SiO_{2/2})_{5-200}(SiO_{4/2})_{5-500}$, $(R^2R^1_2SiO_{1/2})_2(R^1_2SiO_{2/2})_{10-2000}$, $(R^2R^1_2SiO_{1/2})_2(R^fR^1SiO_{2/2})_{10-5000}(R^1_2SiO_{2/2})_{10-5000}(R^2R^1SiO_{2/2})_{1-100}$, $(R^2R^1_2SiO_{1/2})_2(R^1_2SiO_{2/2})_{100-5000}$, $(R^1_3SiO_{1/2})_2(R^1_2SiO_{2/2})_{1-100}(HR^1SiO_{2/2})_{1-200}$, $(HR^1_2SiO_{1/2})_{0.1-10}(SiO_{4/2})_{0.1-5}$ wherein the unit subscripts indicate mole ratios thereof, $(R^1_3SiO_{1/2})_2(R^fR^1SiO_{2/2})_{1-100}(HR^1SiO_{2/2})_{1-200}$, $(HR^1_2SiO_{1/2})_2(R^1_2SiO_{2/2})_{10-2000}$, and $(HSiO_{3/2})_{0.001-1}(R^1SiO_{3/2})_{1.5-0.1}$ wherein the unit subscripts indicate mole ratios thereof. At each occurrence $R^1$, $R^2$ and $R^f$ are as defined in any ad rem embodiment herein (e.g., Embodiment 43). The group $R^1$ can be a $(C_1-C_{20})$hydrocarbyl. The group $R^1$ can be a $(C_1-C_5)$alkyl. The group $R^1$ can be methyl. The group $R^2$ can be a $(C_2-C_{20})$alkenyl. The group $R^2$ can be a vinyl group. In some embodiments, $R^f$ is (perfluoro$(C_1-C_{10})$alkyl)$(C_1-C_{10})$alkyl. In some embodiments, $R^f$ is (perfluorobutyl)ethyl. In some embodiments, the precursor adhesive composition includes at least one of $(R^2R^1_2SiO_{1/2})_{1-8}(R^1_2SiO_{2/2})_{60-180}(SiO_{4/2})_{1-2}$, $(R^2R^1_2SiO_{1/2})_{5-20}(R^1_2SiO_{2/2})_{16-56}(SiO_{4/2})_{25-85}$, $(R^2R^1_2SiO_{1/2})_2(R^1_2SiO_{2/2})_{75-225}$, $(R^2R^1_2SiO_{1/2})_2(R^fR^1SiO_{2/2})_{100-800}(R^1_2SiO_{2/2})_{400-2000}(R^2R^1SiO_{2/2})_{2-30}$, $(R^2R^1_2SiO_{1/2})_2(R^1_2SiO_{2/2})_{400-1200}$, $(R^1_3SiO_{1/2})_2(R^1_2SiO_{2/2})_{1-6}(HR^1SiO_{2/2})_{3-9}$, $(HR^1_2SiO_{1/2})_{1-2}(SiO_{4/2})_{0.5-1.5}$ wherein the unit subscripts indicate mole ratios thereof, $(R^1_3SiO_{1/2})_2(R^fR^1SiO_{2/2})_{2-40}(HR^1SiO_{2/2})_{5-80}$, $(HR^1_2SiO_{1/2})_2(R^1_2SiO_{2/2})_{50-200}$, $(R^1_3SiO_{1/2})_2(R^1_2SiO_{2/2})_{2-40}(HR^1SiO_{2/2})_{5-80}$, and $(HSiO_{3/2})_{0.001-1}(R^1SiO_{3/2})_{1.5-0.1}$ wherein the unit subscripts indicate mole ratios thereof, and wherein $R^1$, $R^2$ and $R^f$ are as defined in any ad rem embodiment herein (e.g., Embodiment 43). In some embodiments, the precursor adhesive composition includes at least one of $(R^2R^1_2SiO_{1/2})_4(R^1_2SiO_{2/2})_{120}(SiO_{4/2})$, $(R^2R^1_2SiO_{1/2})_{11}(R^1_2SiO_{2/2})_{34}(SiO_{4/2})_{55}$, $(R^2R^1_2SiO_{1/2})_2(R^1_2SiO_{2/2})_{150}$, $(R^2R^1_2SiO_{1/2})$ $(R'R^1SiO_{2/2})_{300-600}(R^1{}_2SiO_{2/2})_{800-1000}(R^2R^1SiO_{2/2})_{5-15}$, $(R^2R^1{}_2SiO_{1/2})_2(R^1{}_2SiO_{2/2})_{600}$, $(R^1{}_3SiO_{1/2})_2(R^1{}_2SiO_{2/2})_{3-4}(HR^1SiO_{2/2})_{5-6}$, $(HR^1{}_2SiO_{1/2})_{1.58}(SiO_{4/2})$ wherein the unit subscripts indicate mole ratios thereof, $(R^1{}_3SiO_{1/2})_2(R'R^1SiO_{2/2})_{5-20}(HR^1SiO_{2/2})_{10-40}$, $(HR^1{}_2SiO_{1/2})_2(R^1{}_2SiO_{2/2})_{100}$, and $(R^1{}_3SiO_{1/2})_2(R^1{}_2SiO_{2/2})_{5-20}(HR^1SiO_{2/2})_{10-40}$, and $(HSiO_{3/2})_{0.01-0.5}(R^1SiO_{3/2})_{1-0.5}$ wherein the unit subscripts indicate mole ratios thereof, and wherein $R^1$, $R^2$ and $R'$ are as defined in any ad rem embodiment herein (e.g., Embodiment 43).

In some embodiments, at least one of the precursor adhesive composition, the adhesion promoter precursor composition, and the release layer composition include at least one of a thermoplastic material, a thermoset material, a polymerizable monomer, a polymerizable or crosslinkable oligomer, a polymer, a crosslinkable polymer, a crosslinked polymer, a natural rubber or a synthetic rubber, a polyurethane, a polyisobutylene, a silane, an organosilane, a siloxane, an organosiloxane, a fluorosilicone, a fluorosilane, a shellac, a polyamide, a silyl-modified polyamide, a polyester, a polycarbonate, a polycarbamate, a urethane, a natural adhesive, an epoxy-based adhesive, a furan-based adhesive, a phenolic-based adhesive, an aldehyde-based adhesive, a urea-aldehyde adhesive, an acrylic acid-based adhesive, a phenol/phenol formaldehyde/furfuryl alcohol adhesive, a curing agent, a catalyst, a precursor that is curable to form of any one of the same, and a reaction product of any one of the same. One or more compounds described in this paragraph can form any suitable proportion of the precursor adhesive composition, such as 0.001 wt % to 100 wt %, 0.001 wt % to 90 wt %, 0.001 wt % to 50 wt %, or 0.01 wt % to 20 wt %.

Examples of catalysts can include a hydrosilylation catalyst, a condensation catalyst, a free radical initiator, a photoinitiator, or an acid or base. Examples of hydrosilylation catalysts can include any suitable hydrosilylation catalyst, such as any hydrosilylation catalyst including a platinum group metal or a compound containing a platinum group metal. Platinum group metals can include platinum, rhodium, ruthenium, palladium, osmium and iridium. An example of a suitable hydrosilylation catalyst can include a platinum(IV) complex of 1,3-diethenyl-1,1,3,3-tetramethyl-disiloxane. In another embodiment, the hydrosilylation catalyst can be a photoactivated hydrosilylation catalyst, or a hydrosilylation catalyst microencapsulated in a thermoplastic material.

Examples of curing agents can include at least one of an amine, an aromatic amine, an aliphatic amine, a cycloaliphatic amine, a polyamine, an amide, a polyamide, or an imine. Examples include a polyethyleneimine, piperidine, triethylamine, benzyldimethylamine, N,N-dimethylaminopyridine, 2-(N,N-dimethylaminomethyl)phenol, tris(dimethylaminomethyl)phenol, N-2-(aminoethyl)-3-aminopropyltrimethoxysilane, 3-glycidoxypropyltrimethoxysilane, n-beta-(aminoethyp-gamma-aminopropyl trimethoxysilane, n-beta-(aminoethyl)-gamma-aminopropyl trimethoxysilane, piperazine, derivatives of piperazine (e.g., aminoethylpiperazine), pyrrole, imidazole, pyrazole, pyridine, pyrazine, pyrimidine, pyridazine, indolizine, isoindole, indole, indazole, purine, quinolizine, quinoline, isoquinoline, phthalazine, naphthyridine, quinoxaline, quinazoline, carbazole, carbazole, phenanthridine, acridine, phenathroline, phenazine, imidazolidine, phenoxazine, cinnoline, pyrrolidine, pyrroline, imidazoline, piperidine, indoline, isoindoline, quinuclindine, morpholine, azocine, azepine, 1,3,5-triazine, thiazole, pteridine, dihydroquinoline, hexamethyleneimine, indazole, 2-ethyl-4-methyl imidazole, 1,1,3-trichlorotrifluoroacetone, and combinations thereof.

In various embodiments, at least one of the precursor adhesive composition, the adhesion promoter precursor composition, and the release layer composition can include at least one of an organohydrogensilane, an organohydrogensiloxane, an organoalkenylsilane, and an organoalkenylsiloxane. In some embodiments the precursor adhesive composition can include at least one of a non-linear $(C_2-C_{20})$alkenyl-functionalized organopolysiloxane, a linear $(C_2-C_{20})$alkenyl-functionalized organopolysiloxane, a linear $(C_2-C_{20})$alkenyl-functionalized fluoro$(C_1-C_{20})$alkyl-substituted organopolysiloxane, a non-linear hydrogenorganopolysiloxane, a linear hydrogenorganopolysiloxane, and a $((C_1-C_{20})$hydrocarbyphydrogensilsesquioxane, wherein the $(C_2-C_{20})$alkenyl group and $(C_1-C_{20})$hydrocarbyl are independently selected, substituted or unsubstituted, and are uninterrupted or interrupted by 1, 2, or 3 groups independently chosen from —O—, —S—, substituted or unsubstituted —NH—, —(O—$(C_2-C_3)$alkylene)$_n$- wherein n is 1 to 1,000, —Si$((C_1-C_5)$alkoxy$)_2$-, and —Si$((C_1-C_5)$alkyl$)_2$-. In various embodiments, silsesquioxanes herein can have any suitable molecular weight, such as 100 g/mol to 10,000,000 g/mol, 100 g/mol to 1,000,000 g/mol, or 200 g/mol to 100,000 g/mol. One or more compounds described in this paragraph can form any suitable proportion of the precursor adhesive composition, such as 0.001 wt % to 100 wt %, 0.001 wt % to 90 wt %, 0.001 wt % to 50 wt %, or 0.01 wt % to 20 wt %.

At least one of the precursor adhesive composition, the adhesion promoter precursor composition, and the release layer composition can include at least one of a non-linear vinyldimethylsiloxy-terminated polydimethylsiloxane, a linear vinyldimethylsiloxy-terminated polydimethylsiloxane, a linear vinyldimethylsiloxy-terminated poly(co-(fluoro$(C_m)$alkyl)methylsiloxane-dimethylsiloxane-vinylmethylsiloxane), a linear vinyldimethylsiloxy-terminated polydimethylsiloxane, a linear trimethylsiloxy-terminated poly(co-dimethylsiloxane-hydrogenmethylsiloxane), a hydrogendimethylsiloxy-terminated siloxane, a trimethylsiloxy-terminated poly(co-(fluoro$(C_m)$alkyl)methylsiloxane-dimethylsiloxane), a linear hydrogendimethylsiloxy-terminated dimethylsiloxane, a linear trimethylsiloxy-terminated poly(co-dimethylsiloxane-hydrogenmethylsiloxane), a poly (co-hydrogensilsesquioxane-$((C_1-C_{20})$alkyl)silsesquioxane), and a poly(co-hydrogensilsesquioxane-$((C_6-C_{20})$aryl) silsesquioxane), wherein each fluoro$(C_m)$alkyl independently has about 1 to about 2m+1 fluorine groups and m is independently about 1 to about 20.

The precursor adhesive composition can have any suitable Si—H to alkenyl ratio (e.g., wherein the alkenyl group is a hydrosilylation-curable non-aromatic non-conjugated carbon-carbon double bond), such as 0.1:1 to 10:1, 0.7:1 to 2:1, or 0.1:1 or less, or 0.2:1.

The precursor adhesive composition can have any suitable weight ratio of alkenyl-functional organopolysiloxane to hydrogenorganopolysiloxane, such as 0.001:1 to 1000:1, or 10:1 to 100:1, or 0.001:1 or less.

The display device processing intermediate included a release layer between the display device substrate and the adhesive delamination layer. The release layer can reduce the force needed for removal of the display device substrate from the carrier substrate, adhesive delamination layer, and any other layers present. In some embodiments, the display device processing intermediate can include a release layer between the carrier substrate and the adhesive delamination layer.

The release layer can be a cured reaction product of a release layer precursor composition. The release layer precursor composition can be placed on (e.g., applied to) the display device substrate or to the adhesive delamination layer using any suitable method, such as using at least one of spraying, spinning, a draw-down bar, a doctor-blade, and dipping. The release layer precursor composition can be cured using any suitable method, such as free-radical curing, condensation curing, addition curing (e.g., hydrosilylation), any suitable crosslinking reaction, or a combination thereof. In some embodiments, curing can include drying the release layer precursor composition to remove solvent therefrom. Curing can include the application of light (e.g., visible, infrared, ultraviolet), heat (e.g., 40° C. or less, or 50° C. to 500° C., or 80° C. to 300° C., or from 120° C. to 250° C. for a suitable time, such as 1 minute or less, or 2 minutes, or 1 minute to 120 minutes, irradiation (e.g., using any suitable radiation source, such as electron beam, gamma ray, X-ray), or a combination thereof.

The release layer precursor composition can be any suitable composition that can be cured to form the release layer. The release layer precursor composition can include at least one of a fluorosilane, a fluorosilazane, a fluorosiloxane, a fluoroorganosilane, a fluoroorganosiloxane, a fluorinated silicon resin, a fluorinated silsesquioxane resin, a $(C_6-C_{20})$ arylsiloxane, and a (substituted or unsubstituted $(C_1-C_{20})$ hydrocarbyl)-silsesquioxane, wherein any one or more of the preceding can form any suitable proportion of the release layer precursor composition, such as 0.001 wt % to 99 wt %, 0.001 wt % to 90 wt %, 0.001 wt % to 50 wt %, or 0.01 wt % to 20 wt %. The fluorosilicon compound in the precursor release layer composition can be at least one of a fluorosilane, a fluorosilazane, a fluorosiloxane, a fluoroorganosilane, a fluoroorganosiloxane, a fluorinated silicon resin, and a fluorinated silsesquioxane resin.

In some embodiments, the fluorosilicon compound in the precursor release layer composition can include at least one hydrolyzable linkage, such as at least one of Si—S, Si—O, Si—N, Si—H, Si—Cl, and Si—F. In some embodiments, the fluorosilicon compound can include 1, 2, 3, or 4 or more such hydrolyzable linkages. In various embodiments, the fluorosilicon compound in the precursor release layer composition can be a fluorosilane including at least one hydrolyzable linkage.

In various embodiments, the precursor release layer composition includes a fluoroorganosilane is of formula $R^NSiZ_3$, as defined in Embodiment 14. In some embodiments the precursor release layer composition includes a fluoroorganosilane having the structure $R^NSi(OR^M)_3$, wherein $R^M$ and $R^N$ are as defined herein. The fluoroorganosilane can have the structure $F((CF_2)_3O)_{15-30}CF_2CF_2CH_2O(CH_2)_3Si(OMe)_3$. The fluoroorganosilane can have the structure $F((CF_2)_3O)_{17-25}CF_2CF_2CH_2O(CH_2)_3Si(OMe)_3$.

In some embodiments, the precursor release layer composition includes Component (A), a hydrogenorganopolysiloxane. The precursor release layer composition can also include Component (B), a $(C_2-C_{20})$alkenyl-functionalized organopolysiloxane as defined above.

In various embodiments, the precursor release layer composition includes at least one of a linear Si—H-functional fluoroorganopolysiloxane, a non-linear Si—H-functional fluoroorganopolysiloxane, a linear $(C_2-C_{20})$alkenyl-functional fluoroorganopolysiloxane, and a non-linear $(C_2-C_{20})$alkenyl-functional fluoroorganopolysiloxane.

Any suitable proportion of the precursor release layer composition can be at least one of a linear Si—H-functional fluoroorganopolysiloxane and a non-linear Si—H-functional fluoroorganopolysiloxane, such as about 0.1 wt % to about 99 wt %, about 10 wt % to about 80 wt %, or about 0.2 wt % to about 40 wt %.

The precursor release layer composition can include a non-linear Si—H-functional fluoroorganopolysiloxane having the structure: $(R^A_3SiO_{1/2})_w(R^A_2SiO_{2/2})_x(R^ASiO_{3/2})_y(SiO_{4/2})_z$, wherein $R^A$ and subscripts w, x, y and z are as defined herein.

The precursor release layer composition can include a linear Si—H-functional fluoroorganopolysiloxane having the structure: $(R^A_3SiO_{1/2})_2(R^A_2SiO_{2/2})_x$, wherein $R^A$ and subscript x are as defined herein.

Any suitable proportion of the precursor release layer composition can be at least one of a linear $(C_2-C_{20})$alkenyl-functional fluoroorganopolysiloxane and a non-linear $(C_2-C_{20})$alkenyl-functional fluoroorganopolysiloxane, such as 1 wt % to 99.9 wt %, 10 wt % to 80 wt %, or 40 wt % to 99.9 wt %.

The precursor release layer composition can include a non-linear $(C_2-C_{20})$alkenyl-functional fluoroorganopolysiloxane having the structure: $(R^B_3SiO_{1/2})_w(R^B_2SiO_{2/2})_x(R^BSiO_{3/2})_y(SiO_{4/2})_z$, wherein $R^B$ and subscripts w, x, y and z are as defined herein.

The release layer precursor composition can include a linear $(C_2-C_{20})$alkenyl-functional fluoroorganopolysiloxane having the structure: $(R^B_3SiO_{1/2})_2(R^B_2SiO_{2/2})_x$, wherein $R^B$ and subscript x are as defined herein.

The precursor release layer composition can include a linear Si—H-functional fluoroorganopolysiloxane having the structure: $(R^1_3SiO_{1/2})_2(R^fR^1SiO_{2/2})_{1-5000}(HR^1SiO_{2/2})_{1-5000}$, and a linear $(C_2-C_{20})$alkenyl-functional fluoroorganopolysiloxane having the structure: $(R^2R^1_2SiO_{1/2})_2(R^fR^1SiO_{2/2})_{1-5000}(R^1_2SiO_{2/2})_{1-5000}(R^2R^1SiO_{2/2})_{1-5000}$, wherein $R^1$, $R^2$, and $R^f$ are as defined herein.

The precursor release layer composition can include a linear Si—H-functional fluoroorganopolysiloxane having the structure: $(Me_3SiO_{1/2})_2(R^fMeSiO_{2/2})_{1-5000}(HMeSiO_{2/2})_{1-5000}$, and a linear $(C_2-C_{20})$alkenyl-functional fluoroorganopolysiloxane having the structure: $(ViMe_2SiO_{1/2})_2(R^fMeSiO_{2/2})_{100-2000}(Me_2SiO_{2/2})_{100-3000}(ViMeSiO_{2/2})_{1-100}$, wherein $R^f$ is as defined herein.

In some embodiments, the fluorosilicon compound in the precursor release layer composition can be at least one of a fluorinated silicon resin and a fluorinated silsesquioxane resin. The fluorinated silicon resin or fluorinated silsesquioxane can have the structure: $(R^C_3SiO_{1/2})_a(R^C_2SiO_{2/2})_b(R^CSiO_{3/2})_c(SiO_2)_d$. At each occurrence $R^C$ can be independently chosen from hydrogen, F, $R^f$, $R^1$, and $R^2$, wherein $R^1$, $R^2$, and $R^f$ are as defined herein.

In addition to the at least one fluorosilicon compound, the precursor release layer composition can further include a hydrogensilsesquioxane-$(C_1-C_{20})$hydrocarbylsilsesquioxane copolymer.

The release layer can have any suitable thickness. In some embodiments, the release layer has a thickness of 0.0001 μm to 500 μm, 0.001 μm to 300 μm, 5 μm to 150 μm, or 10 μm to 100 μm.

The precursor adhesive composition, the adhesion promoter precursor composition, and the release layer precursor composition, can include any one or more optional components. Any one or more optional components described in this section can form any suitable proportion of the precursor adhesive composition, the adhesion promoter precursor composition, or the release layer precursor composition, such as 0.001 wt % to 100 wt %, 0.001 wt % to 90 wt %, 0.001 wt % to 50 wt %, 0.01 wt % to 20 wt %, or 0.001 wt % or less.

In some embodiments, at least one of the adhesion promoter precursor composition and the release layer composition includes any one or more compounds described herein as suitable for use in the precursor adhesive composition. The one or more compounds can form any suitable proportion of the adhesion promoter precursor composition or the release layer composition, such 0.001 wt % to 100 wt %, 0.001 wt % to 90 wt %, 0.001 wt % to 50 wt %, 0.01 wt % to 20 wt %, or 0.001 wt % or less, or 0.01 wt %, 1, 2, 3, 4, 5, 10, 15, 20, 25, 30, 35, 40, 45, 50, 60, 70, 80, 90, 91, 92, 93, 94, 95, 96, 97, 98, or 99 wt % or more.

At least one of the precursor adhesive composition, the adhesion promoter precursor composition, and the release layer composition can include at least one of a surfactant, emulsifier, dispersant, polymeric stabilizer, crosslinking agent, polymer, polymerization or crosslinking catalysts, rheology modifier, density modifier, aziridine stabilizers, cure modifier, free radical initiator, diluent, acid acceptor, antioxidant, heat stabilizer, flame retardant, scavenging agent, silylating agent, foam stabilizer, solvent, hydrosilylation-reactive diluent, plasticizer, filler, inorganic particle, pigment, dye, desiccants, liquid, a polyether having at least one alkenyl or akynyl group per molecule, thickening agent, stabilizing agent, wax, wax-like material, silicone, organo-functional siloxane, alkylmethylsiloxanes, siloxane resin, silicone gum, silicone carbinol fluid, water soluble or water dispersible silicone polyether composition, silicone rubber, hydrosilylation catalyst inhibitor, adhesion promoter, heat stabilizer, UV stabilizer, and a flow control additive.

The display device processing intermediate can include an adhesion promoter layer between the carrier substrate and the adhesive delamination layer. The adhesion promoter layer can increase the adhesion between the adhesive delamination layer and the carrier substrate.

The adhesion promoter layer can be a cured reaction product of an adhesion promoter layer precursor composition. The adhesion promoter layer precursor composition can be placed on (e.g., applied to) the display device substrate or to the adhesive delamination layer using any suitable method, such as using at least one of spraying, spinning, a draw-down bar, a doctor-blade, and dipping. The adhesion promoter layer precursor composition can be cured using any suitable method, such as free-radical curing, condensation curing, addition curing (e.g., hydrosilylation), any suitable crosslinking reaction, or a combination thereof. In some embodiments, curing can include drying the adhesion promoter layer precursor composition to remove solvent therefrom. Curing can include the application of light (e.g., visible, infrared, ultraviolet), heat (e.g., 40° C. or less, or 50° C. to 500° C., or 80° C. to 250° C. for a suitable time, such as 1 minute or less, or 2 minutes, or 1 minute to 120 minutes, irradiation (e.g., using any suitable radiation source, such as electron beam, gamma ray, X-ray), or a combination thereof.

The adhesion promoter layer precursor composition can include any one or more materials described herein as suitable for inclusion in the precursor adhesive composition. The adhesion promoter layer precursor composition can include at least one of a silane (e.g., trichlorosilane), an organosilane, an alkoxysilane, a silazane, an organosiloxane, an organotitanate, an organozirconate, a zirconoaluminate, a phosphate ester, acrylic acid or a salt or ester thereof, methylacrylic acid or a salt or ester thereof, a polyurethane monomer or oligomer, vinyl phosphonic acid or a salt or ester thereof, vinyl sulfonic acid or a salt or ester thereof, and 2-acrylamido-2-methyl propane sulfonic acid or a salt or ester thereof.

The adhesion promoter precursor composition can include least one of a silane or siloxane including at least one of a trialkoxysiloxy group (e.g., a tri($C_1$-$C_5$)alkoxySiO—), a trialkoxysilylalkyl group (e.g., tri($C_1$-$C_5$)alkoxysilyl($C_1$-$C_{20}$)alkyl), a hydrosilyl group (e.g., a hydrosilyl-containing silsesquioxane, such as being of formula $(HSiO_{3/2})_{0.01-5}$ (substituted or unsubstituted $(C_1$-$C_{20})$hydrocarbyl $SiO_{3/2})_{0.01-5}$ wherein the unit subscripts indicate mole ratios thereof), an alkenyl group (e.g., a ($C_2$-$C_{20}$)alkenyl group), an epoxy-functional group (e.g., ($C_2$-$C_{20}$)epoxy-functional group), an amino group, a halosilyl group, a mercaptosilyl group, and a fluoroalkylsilyl group.

The adhesion promoter layer can have any suitable thickness. In some embodiments, the adhesion promoter layer has a thickness of 0.0001 μm to 500 μm, 0.001 μm to 300 μm, 5 μm to 150 μm, or 10 μm to 100 μm.

In various embodiments is a display device processing intermediate. The display device processing intermediate can be any display device processing intermediate that can be made using any method described herein. The display device processing intermediate can include a carrier substrate, such as any carrier substrate described herein. The display device processing intermediate can include an adhesive delamination layer on the carrier substrate, such as any adhesive delamination layer described herein. The adhesive delamination layer can include a cured product of a precursor adhesive composition, such as a cured product of any precursor adhesive composition described herein. The display device processing intermediate can include a display device substrate secured to the carrier substrate via the adhesive delamination layer.

The display device processing intermediate includes a release layer between the adhesive delamination layer and the display device substrate. The release layer includes a cured product of a precursor release layer composition that includes at least one fluorosilicon compound. The precursor release layer composition can be precursor release layer composition described herein. In various embodiments is a display device component or a display device formed from the display device processing intermediate.

In some embodiments is a display device processing intermediate 1 as illustrated in FIG. 1. The display device processing intermediate 1 includes an adhesive delamination layer 30 on the carrier substrate 10. The display device processing intermediate 1 includes a display device substrate 50 secured to the carrier substrate 10 via the adhesive delamination layer 30. The display device processing intermediate 1 includes a release layer 40 between the display device substrate 50 and the adhesive delamination layer 30. The release layer 40 can be directly on the display device substrate 50 with no intervening layers. The release layer 40 can be directly on the adhesive delamination layer 30 with no intervening layers. The adhesive delamination layer 30 can be directly on the carrier substrate 10 with no intervening layers.

Figure 2:
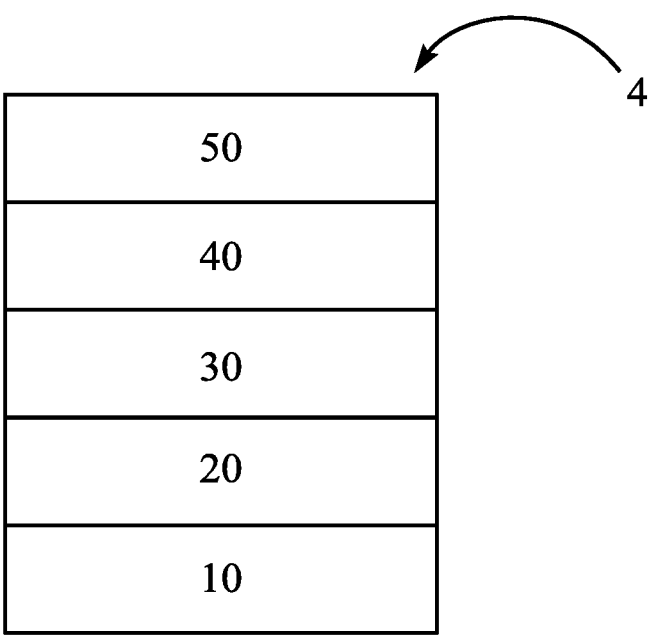
FIG. 2 illustrates a display device processing intermediate, in accordance with various embodiments.

In some embodiments is a display device processing intermediate 2 as illustrated in FIG. 2. The display device processing intermediate 2 includes an adhesive delamination layer 30 on the carrier substrate 10. The display device processing intermediate 2 includes a display device substrate 50 secured to the carrier substrate 10 via the adhesive delamination layer 30. The display device processing intermediate 2 includes an adhesion promoter layer 20 between the carrier substrate 10 and the adhesive delamination layer 30. The display device processing intermediate 2 includes a release layer 40 between the display device substrate 50 and the adhesive delamination layer 30. The adhesion promoter layer 20 can be directly on the carrier substrate 10 with no intervening layers. The adhesive delamination layer 30 can be directly on the adhesion promoter layer 20 with no intervening layers. The release layer 40 can be directly on the adhesive delamination layer 30 with no intervening layers. The display device substrate 50 can be directly on the release layer 40 with no intervening layers.

EXAMPLES

Various embodiments of the present invention can be better understood by reference to the following Examples which are offered by way of illustration. The present invention is not limited to the Examples given herein.

A glass substrate (Fisherbrand® Microscope slide with a dimension of 75 mm×50 mm and thickness of 1.0 mm (Fisher Scientific, Loughborough, UK)) was cleaned by detergent and prepared as a carrier for these Examples.

Peel strength testing. Peel strength was measured by a TMI adhesion tester (Testing Machines, Inc., Delaware, USA) with a peeling rate of 12 inches per minute at room temperature. Laminate structures were affixed to the stage of the adhesion tester using double sided tape, with an adhesion force with glass significantly greater than the maximum peel force of the laminate structures. 3M™ 471 tape with 50 mm width was applied to the release layer in order to create a tail to affix to the clamps of the TMI adhesion tester. The tail created was of length 50 mm to 75 mm extension beyond the release layer edge. The instrument was set up for 90° peel testing. The tape tail was then affixed to the clamps, and the instrument was zeroed. Once zeroed, the test was initiated using the control software. Measurement of peeling force was performed via a force transducer, and with the output given on a computer monitor. Once complete, the maximum peel force was recorded, and the sample was removed. The reported peel strength is an average measurement from at least 3 samples.

Example 1. Preparation of adhesive solution. Siloxane adhesive solution was prepared by mixing vinyl functionalized polydimethylsiloxane $((ViMe_2SiO_{1/2})_2(Me_2SiO_{2/2})_{600})$ and vinyl functional MQ resin $((ViMe_2SiO_{1/2})_{11}(Me_3SiO_{1/2})_{34}(SiO_{4/2})_{55})$ with Si—H functionalized polysiloxane $((Me_3SiO_{1/2})_2(Me_2SiO_{2/2})_{3-4}(HMeSiO_{2/2})_{5-6})$ with Si—H/vinyl ratio of 0.75-2. Then a Pt catalyst and diallyl maleate inhibitor were added, with an inhibitor/catalyst ratio of 50-200.

Example 2. The siloxane adhesive solution of Example 1 was spin coated on the carrier glass with thickness around 10-50 μm depending on the spin rate. Then the carrier was baked at 160° C. for 2 minutes. After cooling down the carrier, a fluorobutyl substituted siloxane solution (a mixture $(ViMe_2SiO_{1/2})(R^fMeSiO_{2/2})_{300-600}(Me_2SiO_{2/2})_{800-1000}(ViMeSiO_{2/2})_{5-15}(ViMe_2SiO_{1/2})$, wherein $R^f$ is (perfluorobutyl)ethyl, and $(Me_3SiO_{1/2})_2(R^fMeSiO_{2/2})_{5-20}(HMeSiO_{2/2})_{10-40}$, wherein $R^f$ is (perfluorobutyl)ethyl) was spin coated on the glass, which was then baked at 160° C. for 2 minutes.

A thin glass Fisherbrand® Microscope cover glass with dimension of 50 mm×45 mm and 0.13 mm to 0.17 mm thickness was then laminated onto the adhesive layer on the carrier at room temperature. The assembly was placed under vacuum at around $10^{-3}$ Torr (0.13 pascal) for 1 hour to achieve close adhesion, and then was put in a preheated oven at 250° C. for 1.5 hours. No outgassing was observed and the thin glass was peeled from the carrier with a clean surface.

Example 3. The siloxane adhesive solution of Example 1 was spin coated on the carrier glass with thickness around 10-150 μm depending on the spin rate. Then the carrier was baked at 160° C. for 2 minutes. After cooling down to room temperature, the adhesive delamination layer was subjected to an air plasma treatment.

A 0.2 wt % perfluoro polyether silane $(F((CF_2)_3O)_{cc}CF_2CF_2CH_2O(CH_2)_3Si(OMe)_3$, where cc is from 17-25) in HFE 7200 (20-80 wt % ethyl nonafluoroisobutyl ether, 20-80 wt % ethyl nonafluorobutyl ether) was then spray coated on to the adhesive delamination layer, followed with curing at 160° C. for 20 minutes in air.

A slim microscope cover glass with dimension of 50 mm×45 mm and 0.13 mm to 0.17 mm thickness was then laminated onto the top of the release layer at room temperature. The assembly was placed under vacuum at around $10^{-3}$ Torr (0.13 pascal) for 1 hour to achieve close adhesion, and then was put in a preheated oven at 250° C. for 30 minutes. No outgassing was observed and the thin glass was peeled from carrier with a clean surface, with a 90 degree peel force of 14 g/cm.

Example 4. The siloxane adhesive solution of Example 1 was spin coated on the carrier glass with thickness around 10-150 μm depending on the spin rate. Then the carrier was baked at 160° C. for 2 minutes.

A 0.2 wt % perfluoroether silane $(F((CF_2)_3O)_{cc}CF_2CF_2CH_2O(CH_2)_3Si(OMe)_3$, where cc is from 17-25) in HFE 7200 (20-80 wt % ethyl nonafluoroisobutyl ether, 20-80 wt % ethyl nonafluorobutyl ether) was spray coated on a slim microscope cover glass with dimension of 50 mm×45 mm and 0.13 mm to 0.17 mm thickness and cured under 160° C. for 20 minutes.

The release layer on the slim glass is then laminated with adhesive delamination layer coated carrier at room temperature. The assembly was placed under vacuum at around $10^{-3}$ Torr (0.13 pascal) for 1 hour to achieve close adhesion, and then was put in a preheated oven at 250° C. for 0.5 hours. No outgassing was observed and the slim glass was peeled from carrier with a with a 90 degree peel force of 14 g/cm.

Example 5. Comparative Example. The siloxane adhesive solution of Example 1 was spin coated on the carrier glass with thickness around 10-50 μm depending on the spin rate. Then the carrier was baked at 160° C. for 2 minutes.

A slim glass Fisherbrand® Microscope cover glass with dimension of 50 mm×45 mm and 0.13 mm to 0.17 mm thickness was then laminated onto the adhesive layer on the carrier at room temperature. The assembly was placed under vacuum at around $10^{-3}$ Torr (0.13 pascal) for 1 hour to achieve close adhesion, and then was put in a preheated oven at 250° C. for 1.5 hours. No out gassing was observed, but the thin glass was firmly adhered to the carrier and could not be peeled from the carrier.

The terms and expressions that have been employed are used as terms of description and not of limitation, and there is no intention in the use of such terms and expressions of excluding any equivalents of the features shown and described or portions thereof, but it is recognized that various modifications are possible within the scope of the embodiments of the present invention. Thus, although the present invention has been specifically disclosed by specific embodiments and optional features, modification and variation of the concepts herein disclosed may be resorted to by those of ordinary skill in the art, and that such modifications and variations are considered to be within the scope of embodiments of the present invention.

The claims which follow are incorporated as numbered aspects here by reference. The numbered aspects are identical to the claims except the words "claim" and "claims" have been replaced by the words "aspect" and "aspects", respectively.

What is claimed is:

1. A method of processing a display device substrate, the method comprising:
    securing the display device substrate to a carrier substrate with an adhesive delamination layer and a release layer between the adhesive delamination layer and the display device substrate, wherein the release layer comprises a cured product of a precursor release layer composition comprising at least one fluorosilicon compound: wherein the release layer composition comprises a fluoroorganosilane being of formula $R^N SiZ_3$, wherein each Z is independently a hydrolyzable group that is H, a halogen atom, or an organoheteryl group, wherein the organoheteryl group is bonded to the Si atom in the formula $R^N SiZ_3$ via a heteroatom that is O, N, or S; or a fluoroorganosilane being of formula $R^N Si(OR^M)_3$, wherein at each occurrence $R^M$ is independently selected from substituted or unsubstituted $(C_1-C_5)$alkyl, wherein $R^N$ is a fluoro$(C_1-C_{200})$alkyl that is otherwise unsubstituted or is further substituted and is uninterrupted or interrupted by 1, 2, or 3 groups independently chosen from —O—, —S—, —(O—$(C_2$-$C_3)$alkylene)$_n$-wherein n is 1 to 1,000, —(O-perfluoro$(C_2$-$C_3)$alkylene)$_n$-, —(O-fluoro$(C_2$-$C_3)$alkylene)$_n$-, —Si$((C_1$-$C_5)$alkoxy)$_2$-, —Si(perfluoro$(C_1$-$C_5)$alkoxy)$_2$-, —Si(fluoro$(C_1$-$C_5)$alkoxy)$_2$-, —Si$((C_1$-$C_5)$alkyl)$_2$-, Si(fluoro$(C_1$-$C_5)$alkyl)$_2$-, and —Si(perfluoro$(C_1$-$C_5)$alkyl)$_2$-.

2. The method of claim 1, wherein the precursor release layer composition comprises at least one of a linear Si—H-functional fluoroorganopolysiloxane, a non-linear Si—H-functional fluoroorganopolysiloxane, a linear $(C_2-C_{20})$alkenyl-functional fluoroorganopolysiloxane, and a non-linear $(C_2-C_{20})$alkenyl-functional fluoroorganopolysiloxane.

3. The method of claim 2, wherein the precursor release layer composition comprises a non-linear Si—H-functional fluoroorganopolysiloxane being of formula:

$$(R^A{}_3SiO_{1/2})_w(R^A{}_2SiO_{2/2})_x(R^ASiO_{3/2})_y(SiO_{4/2})_z,$$

wherein
    at each occurrence, $R^A$ is independently selected from H, $R^1$, and $R^f$,
    at least one $R^A$ in the non-linear Si—H-functional fluoroorganopolysiloxane is H,
    at least one $R^A$ in the non-linear Si—H-functional fluoroorganopolysiloxane is $R^f$,
    at each occurrence $R^1$ is independently a substituted or unsubstituted $(C_1-C_{20})$hydrocarbyl uninterrupted or interrupted by 1, 2, or 3 groups chosen from —O—, —S—, substituted or unsubstituted —NH—, —Si$((C_1$-$C_5)$alkoxy)$_2$-, and —Si$((C_1$-$C_5)$alkyl)$_2$-,
    at each occurrence $R^f$ is independently a fluoro$(C_m)$ alkyl that is otherwise unsubstituted or is further substituted and has 1 to 2m+1 fluorine groups wherein m is independently 1 to 20, wherein the $(C_m)$alkyl group is uninterrupted or interrupted by 1, 2, or 3 groups independently chosen from —O—, —S—, substituted or unsubstituted —NH—, —(O—$(C_2$-$C_3)$alkylene)$_n$- wherein n is 1 to 1,000, —Si$((C_1$-$C_5)$alkoxy)$_2$-, and —Si$((C_1$-$C_5)$alkyl)$_2$-,
    y and z are independently 0 to 5,000,
    at least one of y and z is greater than 0, and
    w and x are independently 0 to 5,000.

4. The method of claim 1, wherein the precursor release layer composition comprises:
    Component (A), a hydrogenorganopolysiloxane; and
    Component (B), a $(C_2-C_{20})$alkenyl-functionalized organopolysiloxane, wherein the $(C_2-C_{20})$alkenyl group is uninterrupted or interrupted by 1, 2, or 3 groups independently chosen from —O—, —S—, substituted or unsubstituted —NH—, —(O—$(C_2$-$C_3)$alkylene)$_n$-wherein n is 1 to 1,000, —Si$((C_1$-$C_5)$alkoxy)$_2$-, and —Si$((C_1$-$C_5)$alkyl)$_2$-;
    wherein at least one of Component (A) and Component (B) is a fluoroorganopolysiloxane.

5. The method of claim 2, wherein the precursor release layer composition comprises a non-linear $(C_2-C_{20})$alkenyl-functional fluoroorganopolysiloxane being of formula:

$$(R^B{}_3SiO_{1/2})_w(R^B{}_2SiO_{2/2})_x(R^BSiO_{3/2})_y(SiO_{4/2})_z,$$

wherein
    at each occurrence, $R^B$ is independently selected from $R^1$, $R^2$, and $R^f$,
    at least one $R^B$ in the non-linear $(C_2-C_{20})$alkenyl-functional fluoroorganopolysiloxane is $R^2$,
    at least one $R^B$ in the non-linear $(C_2-C_{20})$alkenyl-functional fluoroorganopolysiloxane is $R^f$,
    at each occurrence $R^1$ is independently a substituted or unsubstituted $(C_1-C_{20})$hydrocarbyl uninterrupted or interrupted by 1, 2, or 3 groups chosen from —O—, —S—, substituted or unsubstituted —NH—, —Si$((C_1$-$C_5)$alkoxy)$_2$-, and —Si$((C_1$-$C_5)$alkyl)$_2$-,
    at each occurrence $R^2$ is independently a substituted or unsubstituted $(C_2-C_{20})$alkenyl uninterrupted or interrupted by 1, 2, or 3 groups chosen from —O—, —S—, substituted or unsubstituted —NH—, —(O—$(C_2$-$C_3)$alkylene)$_n$- wherein n is 1 to 1,000, —Si$((C_1$-$C_5)$alkoxy)$_2$-, and —Si$((C_1$-$C_5)$alkyl)$_2$-,
    at each occurrence $R^f$ is independently a fluoro$(C_m)$ alkyl that is otherwise unsubstituted or is further substituted and has 1 to 2m+1 fluorine groups wherein m is independently 1 to 20, wherein the $(C_m)$alkyl group is uninterrupted or interrupted by 1, 2, or 3 groups independently chosen from —O—, —S—, substituted or unsubstituted —NH—, —(O—$(C_2$-$C_3)$alkylene)$_n$- wherein n is 1 to 1,000, —Si$((C_1$-$C_5)$alkoxy)$_2$-, and —Si$((C_1$-$C_5)$alkyl)$_2$-,
    y and z are independently 0 to 5,000,
    at least one of y and z is greater than 0, and
    w and x are independently 0 to 5,000.

6. The method of claim 2, wherein the release layer precursor composition comprises a linear $(C_2-C_{20})$alkenyl-functional fluoroorganopolysiloxane being of formula:

$$(R^B{}_3SiO_{1/2})_2(R^B{}_2SiO_{2/2})_x,$$

wherein
    at each occurrence, $R^B$ is independently selected from $R^1$, $R^2$, and $R^f$,
    at least one $R^B$ in the linear $(C_2-C_{20})$alkenyl-functional fluoroorganopolysiloxane is $R^2$,
    at least one $R^B$ in the linear $(C_2-C_{20})$alkenyl-functional fluoroorganopolysiloxane is $R^f$,
    at each occurrence $R^1$ is independently a substituted or unsubstituted $(C_1-C_{20})$hydrocarbyl uninterrupted or interrupted by 1, 2, or 3 groups chosen from —O—, —S—, substituted or unsubstituted —NH—, —Si$((C_1$-$C_5)$alkoxy)$_2$-, and —Si$((C_1$-$C_5)$alkyl)$_2$-,
    at each occurrence $R^2$ is independently a substituted or unsubstituted $(C_2-C_{20})$alkenyl uninterrupted or interrupted by 1, 2, or 3 groups chosen from —O—, —S—, substituted or unsubstituted —NH—, —(O—(C$_2$-C$_3$)alkylene)$_n$- wherein n is 1 to 1,000, —Si((C$_1$-C$_5$)alkoxy)$_2$-, and —Si((C$_1$-C$_5$)alkyl)$_2$-, at each occurrence R$^f$ is independently a fluoro(C$_m$)alkyl that is otherwise unsubstituted or is further substituted and has 1 to 2m+1 fluorine groups wherein m is independently 1 to 20, wherein the (C$_m$)alkyl group is uninterrupted or interrupted by 1, 2, or 3 groups independently chosen from —O—, —S—, substituted or unsubstituted —NH—, —(O—(C$_2$-C$_3$)alkylene)$_n$- wherein n is 1 to 1,000, —Si((C$_1$-C$_5$)alkoxy)$_2$-, and —Si((C$_1$-C$_5$)alkyl)$_2$-, and x is 0 to 5,000.

7. The method of claim 2, wherein the precursor release layer composition comprises a linear Si—H-functional fluoroorganopolysiloxane being of formula:

(R$^1_3$SiO$_{1/2}$)$_2$(R$^f$R$^1$SiO$_{2/2}$)$_{1-5000}$(HR$^i$SiO$_{2/2}$)$_{1-5000}$, and the precursor release layer composition comprises a linear (C$_2$-C$_{20}$)alkenyl-functional fluoroorganopolysiloxane being of formula:

(R$^2$R$^1_2$SiO$_{1/2}$)$_2$(R$^f$R$^1$SiO$_{2/2}$)$_{1-5000}$(R$^1_2$SiO$_{2/2}$)$_{1-5000}$(R$^2$R$^1$SiO$_{2/2}$)$_{1-5000}$, wherein
at each occurrence R$^1$ is independently a substituted or unsubstituted (C$_1$-C$_{20}$)hydrocarbyl uninterrupted or interrupted by 1, 2, or 3 groups chosen from —O—, —S—, substituted or unsubstituted —NH—, —Si((C$_1$-C$_5$)alkoxy)$_2$-, and —Si((C$_1$-C$_5$)alkyl)$_2$-, at each occurrence R$^2$ is independently a substituted or unsubstituted (C$_2$-C$_{20}$)alkenyl uninterrupted or interrupted by 1, 2, or 3 groups chosen from —O—, —S—, substituted or unsubstituted —NH—, —(O—(C$_2$-C$_3$)alkylene)$_n$- wherein n is 1 to 1,000, —Si((C$_1$-C$_5$)alkoxy)$_2$-, and —Si((C$_1$-C$_5$)alkyl)$_2$-, and at each occurrence R$^f$ is independently a fluoro(C$_m$)alkyl that is otherwise unsubstituted or is further substituted and has 1 to 2m+1 fluorine groups wherein m is independently 1 to 20, wherein the (C$_m$)alkyl group is uninterrupted or interrupted by 1, 2, or 3 groups independently chosen from —O—, —S—, substituted or unsubstituted —NH—, —(O—(C$_2$-C$_3$)alkylene)$_n$- wherein n is 1 to 1,000, —Si((C$_1$-C$_5$)alkoxy)$_2$-, and —Si((C$_1$-C$_5$)alkyl)$_2$-.

8. The method of claim 1, wherein the adhesive delamination layer comprises a cured product of a precursor adhesive composition, wherein the precursor adhesive composition comprises at least one of a thermoplastic material, a thermoset material, a monomer, an oligomer, a polymer, a crosslinkable polymer, a crosslinked polymer, a rubber, a polyurethane, a polyisobutylene, a silane, an organosilane, a siloxane, an organosiloxane, a fluorosilicone, a fluorosilane, a fluoroorganosilane, a shellac, a polyamide, a silyl-modified polyamide, a polyester, a polycarbonate, a polycarbamate, a urethane, a natural adhesive, an epoxy-based adhesive, a furan-based adhesive, a phenolic-based adhesive, an aldehyde-based adhesive, a urea-aldehyde adhesive, an acrylic acid-based adhesive, a phenol/phenol formaldehyde/furfuryl alcohol adhesive, a curing agent, a catalyst, a precursor that is curable to form of any one of the same, and a reaction product of any one of the same.

9. The method of claim 8, wherein the precursor adhesive composition comprises at least one of a surfactant, emulsifier, dispersant, polymeric stabilizer, crosslinking agent, polymer, polymerization or crosslinking catalysts, rheology modifier, density modifier, aziridine stabilizers, cure modifier, free radical initiator, diluent, acid acceptor, antioxidant, heat stabilizer, flame retardant, scavenging agent, silylating agent, foam stabilizer, solvent, hydrosilylation-reactive diluent, plasticizer, filler, inorganic particle, pigment, dye, desiccants, liquid, a polyether having at least one alkenyl or akynyl group per molecule, thickening agent, stabilizing agent, wax, wax-like material, silicone, organofunctional siloxane, alkylmethylsiloxanes, siloxane resin, silicone gum, silicone carbinol fluid, water soluble or water dispersible silicone polyether composition, silicone rubber, hydrosilylation catalyst inhibitor, adhesion promoter, heat stabilizer, UV stabilizer, and a flow control additive.

10. The method of claim 8, further comprising forming the adhesive delamination layer on at least one of the carrier substrate and the display device substrate prior to the securing of the display device substrate.

11. The method of claim 2, wherein the precursor release layer composition comprises a linear Si—H-functional fluoroorganopolysiloxane being of formula:

(R$^A_3$SiO$_{1/2}$)$_2$(R$^A_2$SiO$_{2/2}$)$_x$, wherein
at each occurrence, R$^A$ is independently selected from H, R$^1$, and R$^f$,
at least one R$^A$ in the linear Si—H-functional fluoroorganopolysiloxane is H,
at least one R$^A$ in the linear Si—H-functional fluoroorganopolysiloxane is R$^f$,
at each occurrence R$^1$ is independently a substituted or unsubstituted (C$_1$-C$_{20}$)hydrocarbyl uninterrupted or interrupted by 1, 2, or 3 groups chosen from —O—, —S—, substituted or unsubstituted —NH—, —Si((C$_1$-C$_5$)alkoxy)$_2$-, and —Si((C$_1$-C$_5$)alkyl)$_2$-,
at each occurrence R$^f$ is independently a fluoro(C$_m$)alkyl that is otherwise unsubstituted or is further substituted and has 1 to 2m+1 fluorine groups wherein m is independently 1 to 20, wherein the (C$_m$)alkyl group is uninterrupted or interrupted by 1, 2, or 3 groups independently chosen from —O—, —S—, substituted or unsubstituted —NH—, —(O—(C$_2$-C$_3$)alkylene)$_n$- wherein n is 1 to 1,000, —Si((C$_1$-C$_5$)alkoxy)$_2$-, and —Si((C$_1$-C$_5$)alkyl)$_2$-,
x is 0 to 5,000.

12. The method of claim 1, wherein the precursor release layer composition further comprises a hydrogensilsesquioxane—(C$_1$-C$_{20}$)hydrocarbylsilsesquioxane copolymer, wherein the (C$_1$-C$_{20}$)hydrocarbyl is substituted or unsubstituted and is uninterrupted or interrupted by 1, 2, or 3 groups independently chosen from —O—, —S—, substituted or unsubstituted —NH—, —(O—(C$_2$-C$_3$)alkylene)$_n$- wherein n is 1 to 1,000, —Si((C$_1$-C$_5$)alkoxy)$_2$-, and —Si((C$_1$-C$_5$)alkyl)$_2$-.

13. The method of claim 1, wherein the securing provides a display device processing intermediate wherein an adhesion promoter layer is between the carrier substrate and the adhesive delamination layer, wherein the adhesion promoter layer comprises a cured product of an adhesion promoter precursor composition comprising at least one of a silane, an organosilane, an organosiloxane, an organotitanate, an organozirconate, a zirconoaluminate, a phosphate ester, acrylic acid or a salt or ester thereof, methylacrylic acid or a salt or ester thereof, a polyurethane monomer or oligomer, vinyl phosphonic acid or a salt or ester thereof, vinyl sulfonic acid or a salt or ester thereof, and 2-acrylamido-2-methyl propane sulfonic acid or a salt or ester thereof.

14. The method of claim 1, further comprising processing the display device substrate, wherein processing the display device substrate comprises at least one of washing, drying, forming a film, applying a liquid photoresist, exposure to light, development, etching, resist removal, sealing, vapor deposition, adhesion treatment, heating, annealing, irradiating, cooling, and at least one of placing, forming and modifying on the display device substrate at least one of a semiconductor material, a semiconductor device, a diode, a light emitting diode, a transistor, a transistor array, a capacitor, a conductive pathway, a circuit pattern, a gate line, a data line, an electrical connector, an electrode, a transparent electrode, an electrical insulator, an electrically insulating layer, a protective layer, a color filter, a liquid crystal, a hole injection layer, a hole transporting layer, a light emitting layer, a passivation layer, an electrophoretic film, and an electron transporting layer.

15. The method of claim 1, further comprising removing the display device substrate from the carrier substrate.

16. A display device processing intermediate comprising:
a carrier substrate;
an adhesive delamination layer on the carrier substrate;
a display device substrate secured to the carrier substrate via the adhesive delamination layer; and
a release layer between the adhesive delamination layer and the display device substrate, the release layer comprising a cured product of a precursor release layer comprising at least one fluorosilicon compound, wherein the release layer composition comprises a fluoroorganosilane being of formula $R^N SiZ_3$, wherein each Z is independently a hydrolyzable group that is H, a halogen atom, or an organoheteryl group, wherein the organoheteryl group is bonded to the Si atom in the formula $R^N SiZ_3$ via a heteroatom that is O, N, S; or a fluoroorganosilane being of formula $R^N Si(OR^M)_3$, wherein at each occurrence $R^M$ is independently selected from substituted or unsubstituted ($C_1$-$C_5$) alkyl, wherein $R^N$ is a fluoro($C_1$-$C_{200}$)alkyl that is otherwise unsubstituted or is further substituted and is uninterrupted or interrupted by 1, 2, or 3 groups independently chosen from —O—, —S—, —(O—($C_2$-$C_3$)alkylene)$_n$-wherein n is 1 to 1,000, —(O-perfluoro($C_2$-$C_3$)alkylene)$_n$-, —(O-fluoro($C_2$-$C_3$)alkylene)$_n$-, —Si(($C_1$-$C_5$)alkoxy)$_2$-, —Si(perfluoro($C_1$-$C_5$)alkoxy)$_2$-, —Si(fluoro($C_1$-$C_5$)alkoxy)$_2$-, —Si(($C_1$-$C_5$)alkyl)$_2$-, Si(fluoro($C_1$-$C_5$)alkyl)$_2$-, and —Si(perfluoro($C_1$-$C_5$)alkyl)$_2$-.

* * * * *